United States Patent
Wang

(10) Patent No.: US 6,768,364 B2
(45) Date of Patent: Jul. 27, 2004

(54) QUADRATURE SIGNAL GENERATION WITH PHASE ERROR CORRECTION

(75) Inventor: Sung-ho Wang, Seoul (KR)

(73) Assignee: Berkana Wireless, Inc., Campbell, CA (US)

( * ) Notice: Subject to any disclaimer, the term of this patent is extended or adjusted under 35 U.S.C. 154(b) by 0 days.

(21) Appl. No.: 10/245,823

(22) Filed: Sep. 16, 2002

(65) Prior Publication Data

US 2003/0117201 A1 Jun. 26, 2003

Related U.S. Application Data

(63) Continuation of application No. 10/105,092, filed on Mar. 22, 2002, now abandoned.

(30) Foreign Application Priority Data

Mar. 22, 2001 (KR) .................................. 10-2001-0014783

(51) Int. Cl.[7] .............................................. H03H 11/16

(52) U.S. Cl. ........................ 327/254; 327/238; 327/258; 331/137

(58) Field of Search .................................. 327/236–238, 327/239, 243–247, 254, 257–258; 375/298; 331/46, 135–137

(56) References Cited

U.S. PATENT DOCUMENTS

| | | | | |
|---|---|---|---|---|
| 4,908,532 A | * | 3/1990 | Chadwick .................... | 327/236 |
| 6,035,186 A | * | 3/2000 | Moore et al. ................ | 455/313 |
| 6,236,847 B1 | * | 5/2001 | Stikvoort .................... | 455/313 |
| 6,417,712 B1 | * | 7/2002 | Beards et al. ................ | 327/248 |
| 6,560,449 B1 | * | 5/2003 | Liu ............................. | 455/302 |

* cited by examiner

*Primary Examiner*—Minh Nguyen
(74) *Attorney, Agent, or Firm*—Van Pelt & Yi LLP

(57) ABSTRACT

A quadrature signal generator includes a polyphase filter where four resistive elements and four variable capacitive elements are connected alternately in series to form a loop; and a phase corrector that variably controls the capacitance of the variable capacitive elements.

8 Claims, 18 Drawing Sheets

| | | | | |
|---|---|---|---|---|
| n=0 | $\theta_1$ | $\theta_2$ | $\theta_3$ | $\theta_4$ |
| n=1 | $\dfrac{\theta_1+\theta_2}{2}$ | $\dfrac{\theta_1+\theta_2}{2}$ | $\theta_3$ | $\theta_4$ |
| n=2 | $\dfrac{\theta_1+\theta_2}{2}$ | $\dfrac{\theta_1+\theta_3+2\theta_3}{4}$ | $\dfrac{\theta_1+\theta_3+2\theta_3}{4}$ | $\theta_4$ |
| n=3 | $\dfrac{\theta_1+\theta_2}{2}$ | $\dfrac{\theta_1+\theta_3+2\theta_3}{4}$ | $\dfrac{\theta_1+\theta_2+2\theta_3+4\theta_4}{8}$ | $\dfrac{\theta_1+\theta_2+2\theta_3+4\theta_4}{8}$ |
| n=4 | $\dfrac{5\theta_1+5\theta_2+2\theta_3+4\theta_4}{16}$ | $\dfrac{\theta_1+\theta_3+2\theta_3}{4}$ | $\dfrac{\theta_1+\theta_2+2\theta_3+4\theta_4}{8}$ | $\dfrac{5\theta_1+5\theta_2+2\theta_3+4\theta_4}{16}$ |
| ⋮ | | | | |
| n=M | $\dfrac{H\theta_1+J\theta_2+K\theta_3+L\theta_4}{2^M}$ | $\dfrac{H\theta_1+J\theta_2+K\theta_3+L\theta_4}{2^M}$ | $\dfrac{H'\theta_1+J'\theta_2+K'\theta_3+L'\theta_4}{2^{M-2}}$ | $\dfrac{H''\theta_1+J''\theta_2+K''\theta_3+L''\theta_4}{2^{M-1}}$ |
| ⋮ | | | | |
| n=∞ | $\dfrac{(2^\infty/4)^*(\theta_1+\theta_1+\theta_3+\theta_4)}{2^\infty}$ | $\dfrac{(2^\infty/4)^*(\theta_1+\theta_1+\theta_3+\theta_4)}{2^\infty}$ | $\dfrac{(2^\infty/4)^*(\theta_1+\theta_1+\theta_3+\theta_4)}{2^\infty}$ | $\dfrac{(2^\infty/4)^*(\theta_1+\theta_1+\theta_3+\theta_4)}{2^\infty}$ |
| | $=\dfrac{\theta_1+\theta_1+\theta_3+\theta_4}{4}$ | $=\dfrac{\theta_1+\theta_1+\theta_3+\theta_4}{4}$ | $=\dfrac{\theta_1+\theta_1+\theta_3+\theta_4}{4}$ | $=\dfrac{\theta_1+\theta_1+\theta_3+\theta_4}{4}$ |

Figure 6 ated March 22, 2002 which is
QUADRATURE SIGNAL GENERATION WITH PHASE ERROR CORRECTION

CROSS REFERENCE TO RELATED APPLICATIONS

This application is a continuation of co-pending U.S. patent application Ser. No. 10/105,092, entitled QUADRATURE SIGNAL GENERATOR AND PHASE ERROR CORRECTION METHOD filed Mar. 22, 2002 which is incorporated herein by reference for all purposes, which claims priority to Korean Patent Application No. KR 2001-0014783, filed Mar. 22, 2001, which is incorporated herein by reference for all purposes.

FIELD OF THE INVENTION

The present invention relates generally to a quadrature signal generator. More specifically, a phase error correction technique is disclosed.

BACKGROUND OF THE INVENTION

To convert radio frequency (RF) signals into baseband signals directly through the mixer of an RF transceiver unit, it is customary to receive a signal from the oscillator, generate a quadrature signal with a phase difference of 90 degrees, and send it to the mixer. FIG. 1 is a circuit diagram of a polyphase filter used to generate such a quadrature signal. Polyphase filter circuit (10) includes resistors (R) and capacitors (C) configured as shown.

In the polyphase filter (10) in FIG. 1, four resistors (R1, R2, R3, and R4) and four capacitors (C1, C2, C3, and C4) are connected in series alternately to form a loop. Output terminal (OUT1) is set up at the common point of resistor (R1) and capacitor (C1), output terminal (OUT2) is set up at the common point of resistor (R2) and capacitor (C2), output terminal (OUT3) is set up at the common point of resistor (R3) and capacitor (C3), and output terminal (OUT4) is set up at the common point of resistor (R4) and capacitor (C4). Clock (CLK) of the oscillator (not shown) is input at the common point of capacitor (C1) and resistor (R2) and at the common point of capacitor (C4) and resistor (R1), and clock (CLK_b) of the inverse phase with regard to clock (CLK) of the oscillator is input at the common point of capacitor (C2) and resistor (R3) and at the common point of capacitor (C3) and resistor (R4).

The polyphase filter (10) shown in FIG. 1 produces four signals with a quadrature phase of 0, 90, 180, and 270 degrees respectively, through output terminals (OUT1–OUT4) based on the two input signals of clock (CLK) with a phase of 0 degrees and clock (CLK_b) of the inverse phase of 180 degrees generated from the oscillator.

However, if polyphase filter (10) of the above configuration is applied to a direct conversion transceiver that uses high frequencies, above 5 GHz, the phase difference between the above output signals (OUT1, OUT2, OUT3, and OUT4) would not be exactly 90 degrees. Accordingly, the modulated signals would not be correctly demodulated, and modulation itself would also be difficult. Such phase errors may be caused by bandwidth frequency change, chip process variation during manufacturing of the polyphase filter, impedance mismatch between the resistors and the capacitors of the polyphase filter, and/or a different voltage dependence. It would be useful if such phase errors could be corrected and the undesirable effects of such errors avoided.

BRIEF SUMMARY OF THE INVENTION

A quadrature signal generator is provided including a polyphase filter where four resistive elements and four variable capacitive elements are connected alternately in series to form a loop, including a first output terminal connected to the common point of a first resistive element and a first variable capacitive element a second output terminal connected to the common point of a second resistive element and a second variable capacitive element, a third output terminal connected to the common point of a third resistive element and a third variable capacitive element, a fourth output terminal connected to the common point of a fourth resistive element and a fourth variable capacitive element, a first input terminal at the common point of the first variable capacitive element and the second resistive element and at the common point of the fourth variable capacitive element and the first resistive element, a second input terminal at the common point of the second variable capacitive element and the third resistive element and at the common point of the third variable capacitive element and the fourth resistive element, and wherein the phase corrector is connected between the output terminals and the variable capacitive elements, variably controlling the capacitance of the variable capacitive elements based on the signals output from the output terminals, and a phase corrector that variably controls the capacitance of the variable capacitive elements.

BRIEF DESCRIPTION OF THE DRAWINGS

The present invention will be readily understood by the following detailed description in conjunction with the accompanying drawings, wherein like reference numerals designate like structural elements, and in which:

FIG. 6 shows the mathematical description of the phase changes of the output waveform of the polyphase filter following sequential performance of each mode in the embodiment of FIG. 3.

DETAILED DESCRIPTION

Figure 1:
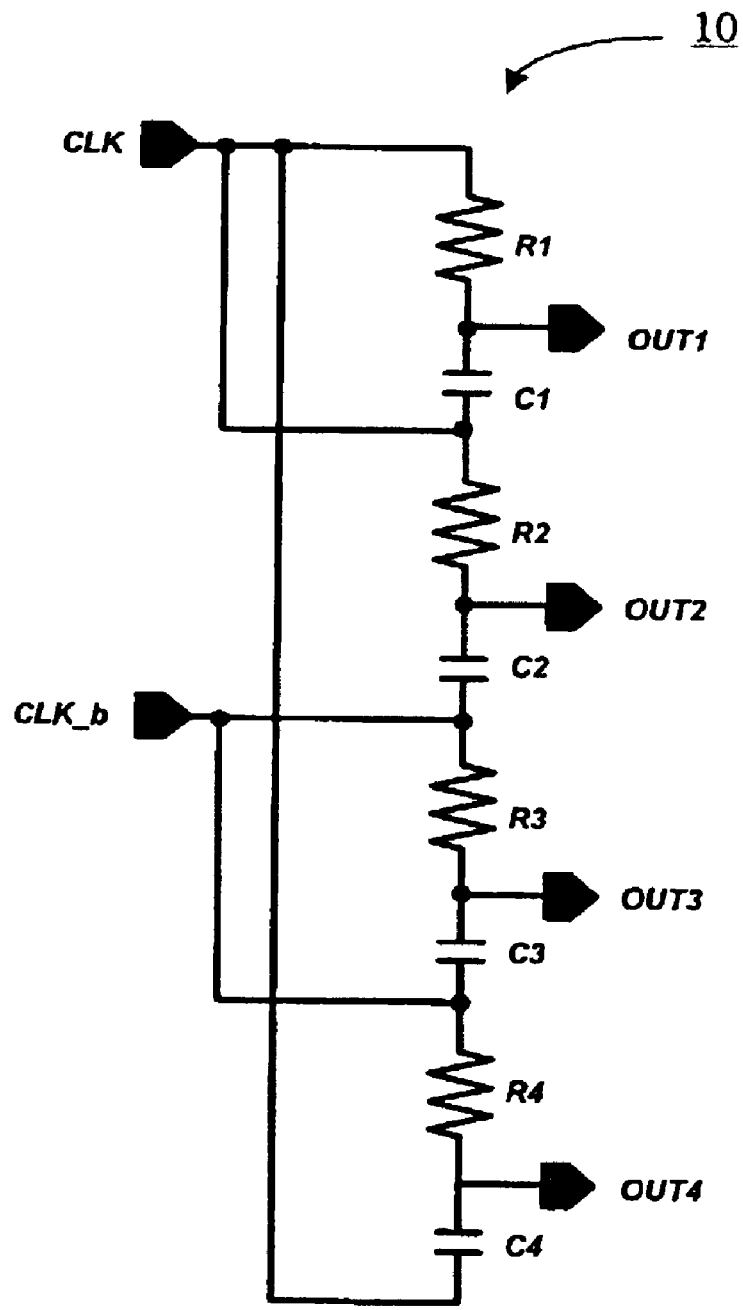
FIG. 1 is a circuit diagram of a polyphase filter.

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A quadrature signal generator using a polyphase filter and phase error correction is described. The quadrature signal generator using a polyphase filter and phase error correction provides an improved quadrature signal required for upward and/or downward direct conversion of frequencies through the mixer of a direct conversion transceiver. The disclosed system resolves the problems mentioned above by generating quadrature signals of 90-degree phase difference from output signals from Voltage Control Oscillators (VCO) and to using them as the Local Oscillation (LO) signals to be input into the mixer of a direct conversion transceiver. Also, a quadrature signal generator is provided using a polyphase filter and a phase error correction method that produces optimum quadrature signals through correction of phase errors between the quadrature signals with minimum power consumption.

The quadrature signal generator with phase error correction provides an improved quadrature signal for upward and/or downward direct conversion of frequencies through a mixer in a direct conversion transceiver. In one embodiment, a polyphase filter includes four resistors and four varactors that alternately form a loop of serial connections, and a Phase Correction Device for variable control of the capacitance of the varactors based on the phases of the quadrature signals generated through the output terminals of the polyphase filter. The Phase Correction Device operates as follows: in the first stage, select and hold the four quadrature signals generated through the output terminals one by one in sequence for a certain period of time; in the second stage, select the two quadrature signals adjacent to the signals in the first stage alternately multiple times while the selected signals are held in the first stage; in the third stage, detect alternately the phase difference between the signals selected in the first stage and the signals selected alternately in the second stage; and then correct the phase error between the four quadrature signals generated through output terminals by variably controlling the capacitance of the corresponding varactors so that the phase of the signal selected in the first stage can be corrected based on the average of the two phase differences detected alternately in the third stage.

Figure 2:
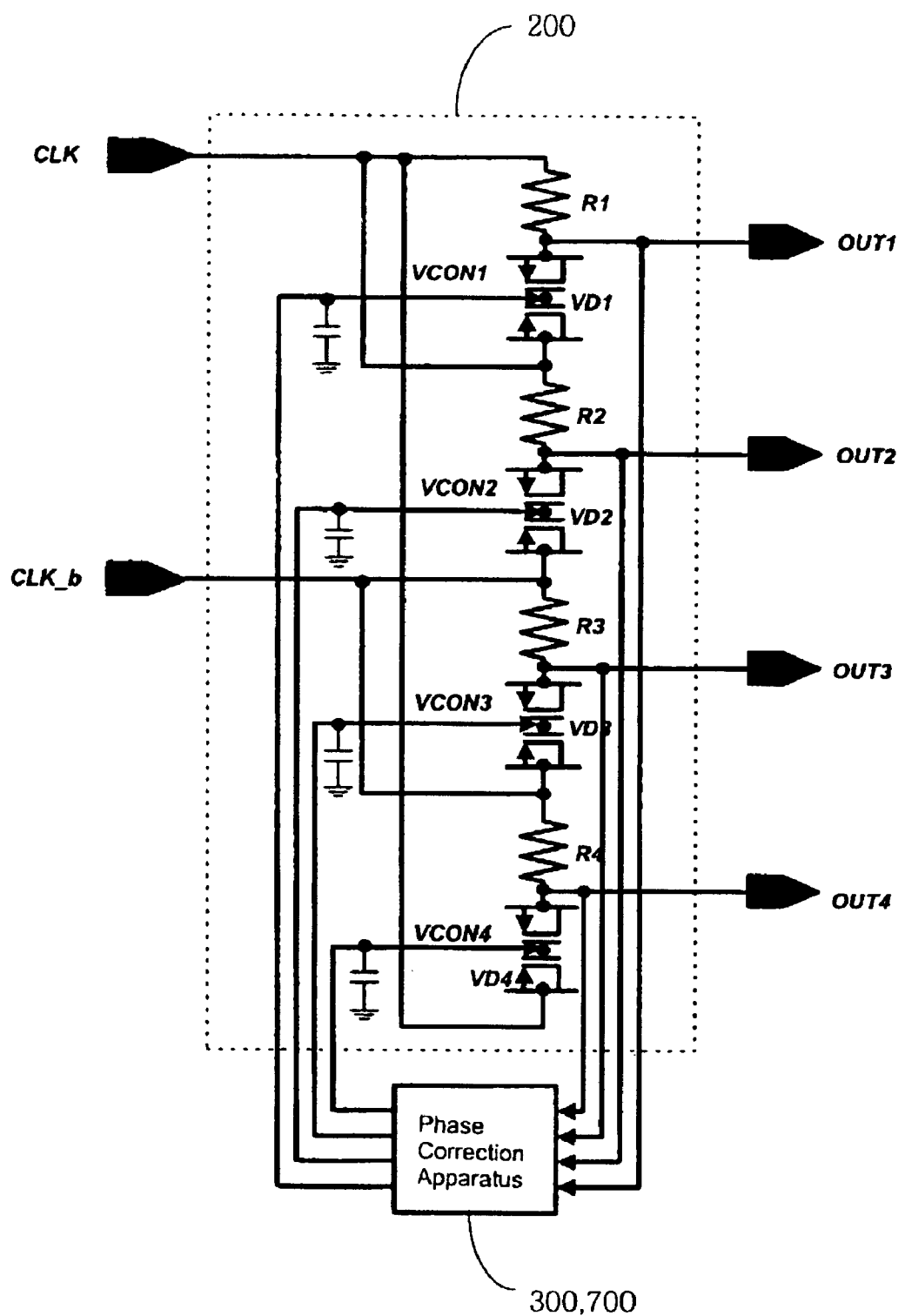
FIG. 2 is a circuit diagram of a polyphase filter in accordance with a first embodiment.

FIG. 2 is a circuit diagram of a polyphase filter embodiment in accordance with the present invention. Element 200 is the polyphase filter. As illustrated in the drawing, four resistors (R1, R2, R3, and R4) as the resistive elements and four varactors (VD1, VD2, VD3, and VD4) as the variable capacitive elements are connected alternately in series to form a loop.

Output terminal (OUT1) is connected at the common point of the resistor (R1) and the varactor (VD1), output terminal 2 (OUT2) is connected at the common point of the resistor (R2) and the varactor (VD2), output terminal (OUT3) is connected at the common point of the resistor (R3) and the varactor (VD3), and output terminal (OUT4) is connected at the common point of the resistor (R4) and the varactor (VD4).

Input terminal (CLK) is connected at the common point of the varactor (VD1) and the resistor (R2) and at the common point of the varactor (VD4) and the resistor (R1), and input terminal (CLK_b) is connected at the common point of the varactor (VD2) and the resistor (R3) and at the common point of the varactor (VD3) and the resistor (R4).

Each of the varactors (VD1, VD2, VD3, and VD4), includes two PMOS transistors (PMOS1, PMOS2), where the gates of the PMOS1 and PMOS2 are connected to each other. The source and the drain of the PMOS1 and PMOS2 are connected to each other and are connected to the adjacent resistor (R1, R2, R3 or R4). A variable terminal is established for varying the capacitance of the corresponding varactor (VD1–VD4) at the common point of the gates of the corresponding PMOS1 and PMOS2 of each varactor (VD1, VD2, VD3, and VD4).

Also, a phase correction apparatus (300) is added between the variable terminal of each said varactor (VD1–VD4) and the output terminals (OUT1–OUT4). The purpose of the phase correction apparatus (300) is to correct the phase error of the quadrature signals, which are output through the output terminals (OUT1–OUT4), by variably controlling the capacitance of the varactors (VD1–VD4) based on the signals output through the output terminals (OUT1–OUT4). Four capacitors (C) with one end grounded are connected on the line that connects the output terminals of the phase correction apparatus (300) and the variable terminals of each varactor (VD1–VD4).

Figure 3:
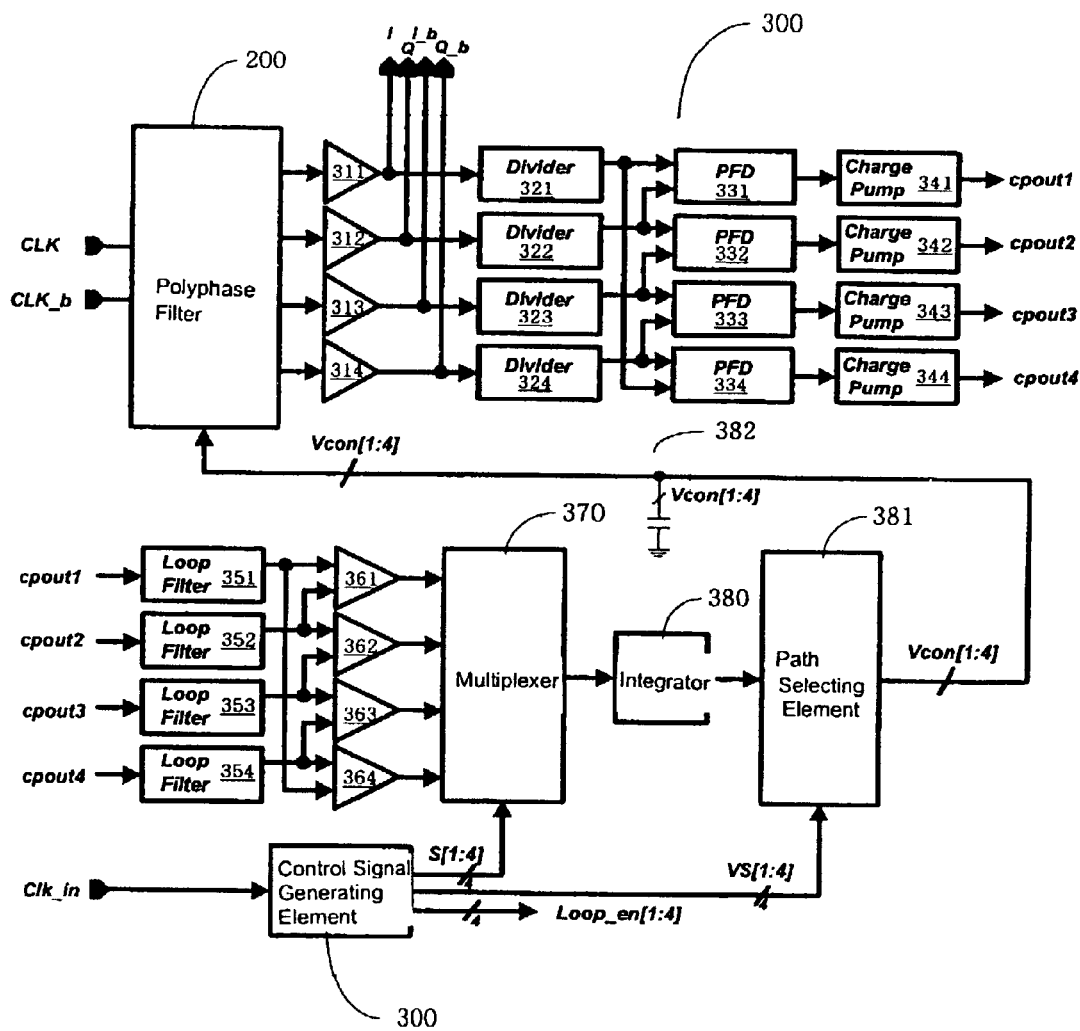
FIG. 3 is a block diagram of a quadrature signal generator in accordance with a first embodiment.

FIG. 3 is a block diagram of a quadrature signal generator embodiment according to the present invention. The quadrature signal generator includes polyphase filter (200) as shown in FIG. 2 and phase correction apparatus (300). Polyphase filter (200), receives through input terminals clock 1 (CLK) with a phase of 0 degrees and clock 2 (CLK_b) with an inverse phase of 180 degrees from a source such as a voltage control oscillator (not shown), and outputs four signals (I, Q, I_b, and Q_b) with quadrature phases through the output terminals (OUT1–OUT4), and the phase correction apparatus (300).

The phase correction apparatus (300) includes: Drivers (311, 312, 313, and 314) that receive four quadrature signals (I, Q, I_b, and Q_b) from the output terminals (OUT1–OUT4) of the polyphase filter (200) and output them after driving; Dividers (321, 322, 323, and 324) that receive feedback input of the four quadrature signals from drivers (311–314) and output them after dividing; Phase Frequency Detectors (PFD) (331, 332, 333, and 334) that receive two signals in sequential pairs out of the four signals from the dividers (321–324), detect the phase difference of each pair of signal, and output the current signal corresponding to the phase difference so detected; Charge Pumps (341, 342, 343, and 344) that charge or discharge in response to each of the four current signals from the phase frequency detectors (331–334); Loop Filters (351, 352, 353, and 354) that filter each voltage output following the charging or discharging of the charge pumps (341–344); Comparators (361, 362, 363, and 364) that receive two signals in sequential pairs out of the four voltage signals, which are filtered in the loop filters (351–354), compare the magnitudes of each pair of signals, and output a digital clock signal based on the result of such comparison; the Multiplexer (MUX) (370) that multiplexes the clock signals output from the comparators (361–364) and outputs one selected signal; the Integrator (380) that integrates the one clock signal selected and output as described above; Path Selecting Element (381) that selects the path for the output signal of the integrator to be supplied as the voltage (control) signal (Vcon1~Vcon4) for varying the capacitance selectively to each variable terminal of the varactors (VD1–VD4) of the polyphase filter (200); the Control Signal Generating Element (390) that generates various control signals (b~m) of FIG. 4 based on the reference clock signal (CLK_in), which is either received from outside or is self-oscillating, and outputs, according to predefined rules, such signals as a first clock signals (also known as loop enable signals) (Loop_en1–Loop_en4) that form a signal loop by controlling the operation of the drivers (311–314), the dividers (321–324), the phase frequency detectors (331–334), the charge pumps (341–344), the loop filters (351–354), and the comparators (361–364), and enabling one or more components to operate according to predefined rules, and a second clock signal (or the signal selection holding signal) (S1–S4) that controls the selection of the output signal and the output holding time in the multiplexer (370), and a third clock signal (or the path selection signal) (VS1–VS4) that controls the path selection of the path selecting element (381); and the Voltage Control Signal Holding Element that holds the voltage control signal output from the path selecting element for a certain time; and the Signal Holding Element (382) that holds the voltage (control) signals (Vcon1~Vcon4), which are output from the path selecting element (381), on each relevant path for a certain period of time.

Signal holding element (382) is composed in the same manner as the four capacitors (C) illustrated in FIG. 2. In some embodiments, it is included in the components of the polyphase filter (200) during the manufacturing process of the polyphase filter (200). In some embodiments, it is included in the components of the phase correction apparatus (300) during the manufacturing process of the phase correction apparatus (300).

Figure 4:
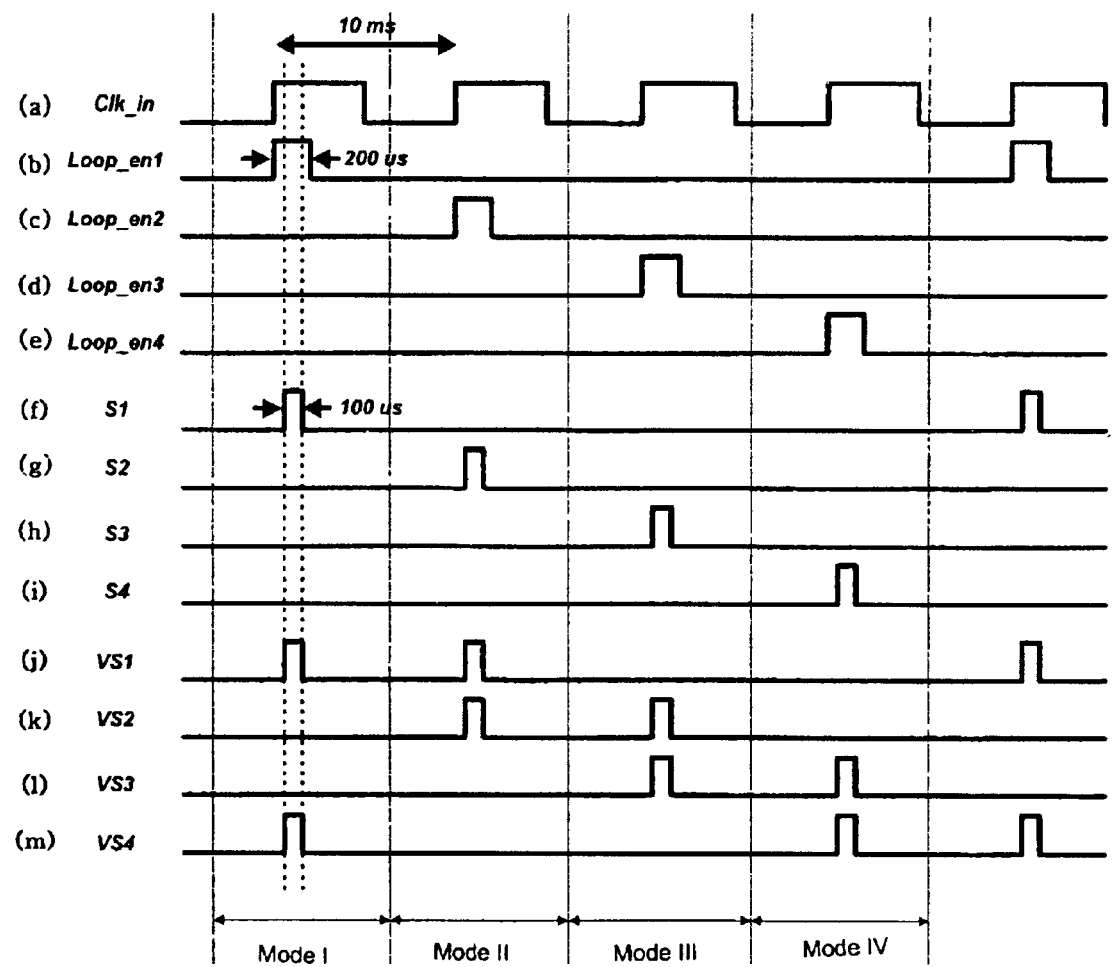
FIG. 4 is a clock timing diagram of various control signals generated from a control signal generating element in FIG. 3.

The operation of the quadrature signal generator as shown in FIG. 3 will now be described. FIG. 4 is a clock timing diagram of various control signals that are generated from the control signal generator (390) in FIG. 3. Signal (a) is the reference clock signal (CLK_in), which is either input from outside or is self-oscillating, with a clock period of 10 ms. Based on this reference clock signal (CLK_in), various control signals (b) through (m) are generated.

Signals (b) through (e) show the loop enable signals in sequence, which are enabled maintaining a high clock of 200 to ensure sufficient signal loops. Signal (b) is the clock timing diagram of the loop enable signal (Loop_en1) that enables only dividers (321, 322, and 324) among the dividers (321–324) and in relation hereto enables the phase frequency detectors (331, 334), the charge pumps (341, 344), the loop filters (351, 354), and the comparator 4 (364) to form a signal loop.

Signal (c) is the clock timing diagram of the loop enable signal (Loop_en2) that enables only dividers (321, 322, and 323) and in relation hereto enables the phase frequency detectors (331, 332), the charge pumps (341, 342), the loop filters (351, 352), and the comparator (361) to form a signal loop.

Signal (d) is the clock timing diagram of the loop enable signal (Loop_en3) that enables only dividers (322, 323, and 324) and in relation hereto enables the phase frequency detectors (332, 333), the charge pumps (342, 343), the loop filters (352, 353), and the comparator (362) to form a signal loop.

Signal (e) is the clock timing diagram of the loop enable signal (Loop_en4) that enables only dividers (323, 324, and 321) and in relation hereto enables the phase frequency detectors (333, 334), the charge pumps (343, 344), the loop filters (353, 354), and the comparator (364) to form a signal loop.

Here, since the multiplexer (370), the integrator (380), the path selecting element (381) and the signal holding element (382) are single components, they remain constantly enabled during the operation of this invention.

Based on the above description, the following control Table 1 is generated in accordance with each loop enable signal and its corresponding sequential mode:

TABLE 1

| Mode | Loop_en | Divider | PFD | Charge Pump | Loop Filter | Comparator | Multiplexer | Path Selecting Element |
|---|---|---|---|---|---|---|---|---|
| I | Loop_en 1 | 4, 1, 2 | 1, 4 | 1, 4 | 1, 4 | 4 | S1 | VS1, VS4 |
| II | Loop_en 2 | 1, 2, 3 | 1, 2 | 1, 2 | 1, 2 | 1 | S2 | VS1, VS2 |
| III | Loop_en 3 | 2, 3, 4 | 2, 3 | 2, 3 | 2, 3 | 2 | S3 | VS2, VS3 |
| IV | Loop_en 4 | 3, 4, 1 | 3, 4 | 3, 4 | 3, 4 | 3 | S4 | VS3, VS4 |

By referring to Table 1 above, the operation of the embodiment shown in FIG. 3 is explained. For the purpose of explanation, mode I is regarded, when the loop enable signal 1 (Loop_en1) occurs, as the initial state, and then assume the phase differences of signal I, signal Q, signal I_b, and signal Q_b, each of which is output from output terminals (OUT1–OUT4) of the polyphase filter (200) in its initial state, to be θ1, θ2, θ3, and θ4 as shown in diagram (I) in FIG. 5.

In the initial state as above, the control signal generating element (300) generates the loop enable signal 2 (Loop_en2) and enables the dividers 1, 2 and 3 (321, 322, and 323), the phase frequency detectors 1 and 2 (331, 332), the charge pumps 1 and 2 (341, 342), the loop filters 1 and 2 (351, 352), and the comparator 1 (361) to enter the mode II.

At this time, the signal I, signal Q and signal I_b are input to and divided in the enabled dividers 1, 2 and 3 (321, 322, 323), respectively. The enabled phase frequency detector 1 (331) receives output from the dividers 1 and 2 (321, 322) and detects the phase difference, θ1, of the two signals, while the enabled phase frequency detector 2 (332) receives output from the dividers 2 and 3 (322, 323) and detects the phase difference, θ2, of the two signals, each producing an output of a current signal corresponding to the result of such detection.

The enabled charge pump 1 (341) and charge pump 2 (342) charge or discharge in proportion to the phase differences as detected above, and the enabled loop filters 1 and 2 (351, 352) filter and output the voltage signals following the charging or discharging of the charge pumps 1 and 2 (341, 342).

The two signals, which are output from the loop filters 1 and 2 (351, 352), are input to the enabled comparator 1 (361) and compared as to magnitude. Based on the result of such comparison (i.e., θ1<θ2 or θ1>θ2), a high or low digital pulse is output and supplied as the input to the multiplexer (370).

The multiplexer (370), in accordance with the signal selection holding signal (S2) in FIG. 4 as applied from the control signal generating element (390), selects the above digital pulse signal input and maintains its output.

The digital pulse signal, which is output from the multiplexer (370), is received and integrated in the integrator (380) and supplied as the input to the path selecting element (381), which, in accordance with path selection signals 1 and 2 (VS1, VS2) in FIGS. 4(j) and (k) as applied from the control signal generating element (390), selects the output paths for the above input signals to be supplied as the voltage (control) signals (Vcon1, Vcon2) for varying the capacitance of the varactors 1 and 2 (VD1, VD2) among the varactors (VD1–VD4) of the polyphase filter (200). As a result of the loop operation in mode II, I,Q and Q,I_b, which were θ1 and θ2 respectively in FIG. 5 (I) in mode I, become the same as (θ1+θ2)/2 and (θ1+θ2)/2 as shown in FIG. 5 (II).

Figure 5:
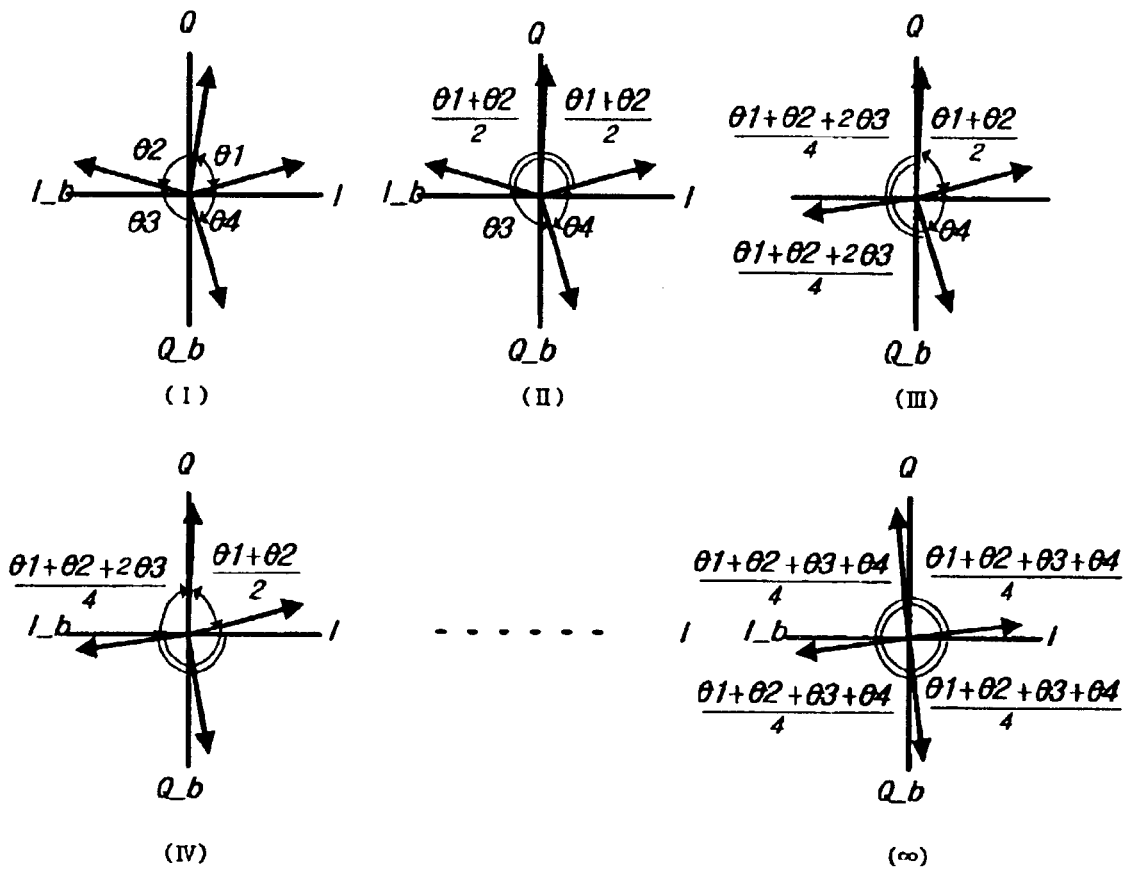
FIG. 5 shows the phase changes of the output waveform of the polyphase filter following sequential performance of each mode in the embodiment of FIG. 3.

In mode III, if the loop enable signal 3 (Loop_en3) is sent as in FIG. 4(d), the signal selection holding signal (S3) as in (h), and the path selection signal (VS2, VS3) as in (k) and (l) to each relevant component systematically, and if the voltage control signals (Vcon2, Vcon3) are generated from the relevant loops in the present mode III as a feedback of signal Q, signal I_b and signal Q_b (here, the phase differences between signals, Q,I_b and I_b,Q_b, are (θ1+θ2)/2 and θ3, respectively), which are output through the output terminals 2 through 4 (OUT2–OUT4) as a result of the mode II, are applied to the variable terminals of the varactors 2 and 3 (VD2, VD3), changing the capacitance of the relevant varactors, then as a result Q,I_b and I_b,Q_b, which were (θ1+θ2)/2 and θ3 respectively in FIG. 5 (II) in the mode II, become the same as (θ1+θ2+2θ3)/4 and (θ1+θ2+2θ3)/4 as shown in FIG. 5 (III).

Further, in mode IV, if you send the loop enable signal 4 (Loop_en4) as in FIG. 4(e), the signal selection holding signal (S4) as in (i), and the path selection signals (VS3, VS4) as in (l) and (m) to each relevant component systematically, and if the voltage control signals (Vcon3, Vcon4) generated from the relevant loops in the present mode IV as a feedback of signal I_b, signal Q_b and signal I (the phase differences between the signals, I_b, Q_b and Q_b,I are (θ1+θ2+2θ3)/4 and θ4, respectively.), which are output through the output terminals 3, 4 and 1 (OUT3, OUT4, OUT1) as a result of the mode III, are applied to the variable terminals of the varactors 3 and 4 (VD3, VD4), changing the capacitance of the relevant varactors, then as a result_b, Q_b and Q_b,I which were (θ1+θ2+2θ3)/4 and θ4 respectively in FIG. 5 (III) in the mode III, become the same as (θ1+θ2+2θ3+4θ4)/8 and (θ1+θ2+2θ3+4θ4)/8 as shown in FIG. 5 (IV).

In the above operations, the voltage control signals (Vcon), other than the voltage control signals (Vcon) selected in any mode operation, are stored in the relevant signal holding element (382 or C) that corresponds to the relevant mode of prior operation and maintains a certain value for a certain period of time, and this time interval depends on the leakage characteristics of the capacitor (C) that comprises the signal holding element (382). For example, when the voltage control signals (Vcon3, Vcon4) selected by the operation of the mode IV are applied to the variable terminals of the varactors 3 and 4 (VD3, VD4), the other voltage control signals (Vcon1, Vcon2) not selected are stored in the signal holding element (382 or C) corresponding to the previous modes I, II, and III, and are applied to the relevant varactors while maintaining a certain value for a certain period of time (e.g., until the next selection). Since only the relevant loops may be operated in sequence according to the enable signal (Loop_en) and not all the block components have to operate simultaneously, considerable power savings can be made. In other words, we can minimize power consumption by correcting the phase differences between the signals I, Q, I_b and Q_b one by one in sequence and by maintaining the other three phases as previously corrected.

As described above, if we repeat modes I, II, III and IV infinitely in sequence, then as a result the phase difference between signals I, Q, I_b and Q_b that are output respectively through the output terminals (OUT1–OUT4) will be all the same as (θ1+θ2+θ3+θ4)/4 as shown in FIG. 5 (∞), each of the phase differences being 90 degrees. Therefore, the more the operation is repeated, the smaller the phase error range between the signals.

FIG. 6 shows a mathematical representation of the above. If θ1, θ2, θ3, and θ4 are the phase differences between signals I, Q, I_b and Q_b, which are output respectively through output terminals (OUT1–OUT4) at the initial state of n=0, and let n is the sequential number of the high clock in the reference clock signal (CLK_in) in FIG. 4, then FIG. 6 is a mathematical representation of the phase differences between signals I, Q, I_b and Q_b that are output respectively through the output terminals (OUT1–OUT4) as a result of sequential operation of each of the modes. Here, if n=M, then the relationships of H+J+K+L=2 M, H+J+K+L=2 M−2, and H+J+K+L=2 M−1 are established. If n approaches infinity, all of the coefficients will have an infinitely large value, rendering the four phase differences equal.

Figure 7:
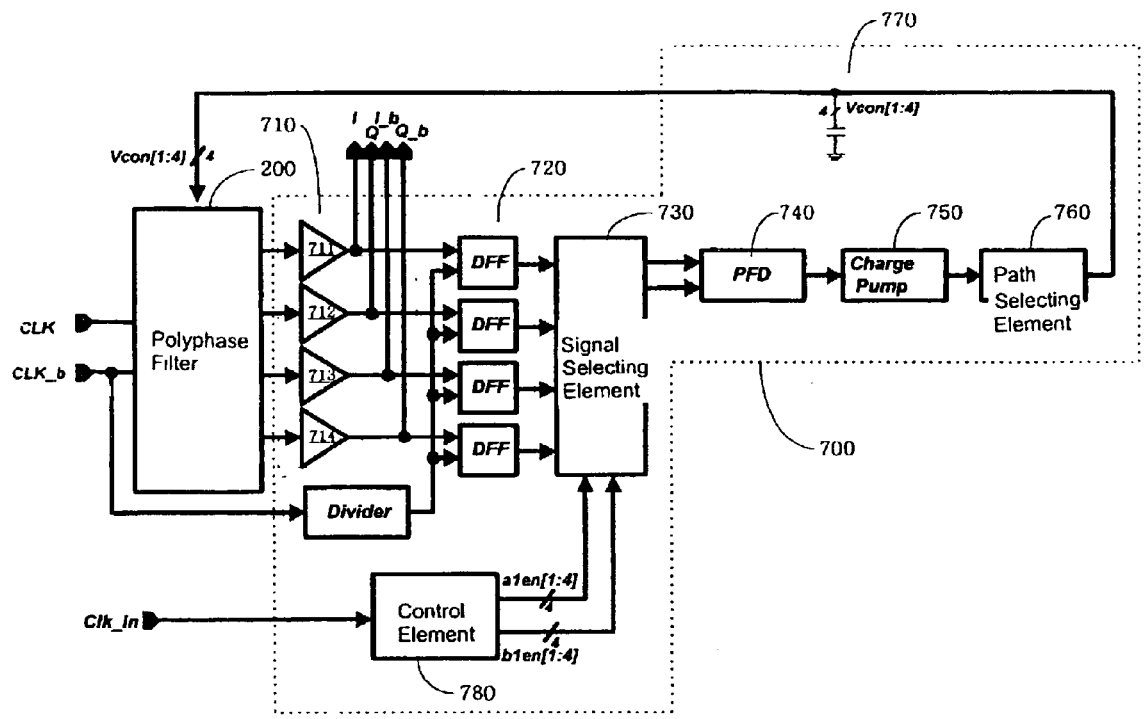
FIG. 7 is a block diagram of a quadrature signal generator in accordance with a second embodiment of this invention.

FIG. 7 is a block diagram of the quadrature signal generator in accordance with a second embodiment of this invention. When compared with FIG. 3 for a first embodiment of this invention, a new phase correction apparatus (700) replaces the phase correction apparatus (300) to combine systematically with the polyphase filter (200) in FIG. 2.

FIG. 7 includes the polyphase filter (200), which receives through the input terminals 1 and 2 (CLK, CLK_b) clock 1

(CLK) has a phase of 0 degrees and clock 2 (CLK_b) has an inverse phase of 180 degrees as supplied from, for example, a voltage control oscillator (not shown) and outputs four signals (I, Q, I_b, and Q_b) with quadrature phases (of 0, 90, 180 and 270 degrees, respectively) through the output terminals (OUT1–OUT4), and the phase correction apparatus (300).

The phase correction apparatus (700) includes: Drivers (710: 711, 712, 713, and 714) that receive four quadrature signals (I, Q, I_b, and Q_b) from the output terminals (OUT1–OUT4) of the polyphase filter (200) and output them after driving; the Divider (720) that takes four quadrature signals (I, Q, I_b and Q_b) in parallel from output terminals (711–714), divides them, and outputs them in parallel; the Signal Selecting Element (730) that selects two adjacent signals as a pair of output signals among the four signals that are divided and output in parallel; the Phase Frequency Detector (740) that detects the phase difference of the pair of signals output from the signal selecting element (730) and outputs the corresponding current signal; the Charge Pump (750) that charges or discharges in response to the current signal output; the Path Selecting Element (760) that selects the path for one of the voltage signals (one of Vcon1~Vcon4) following the charging or discharging to be provided selectively to one or more of the varactors (VD1~VD4) of the polyphase filter (200); the Signal Holding Element (770) that holds (outputs) the voltage signal (one of Vcon1~Vcon4) for a certain time, which is provided to the variable terminal of the selected varactor(s) (one or more of VD1~VD4) through the path selecting element (760); and the Control Element (780) that controls the signal selection in the signal selecting element (730) and the path in the path selecting element (760) based on the reference clock signal.

Figure 8:
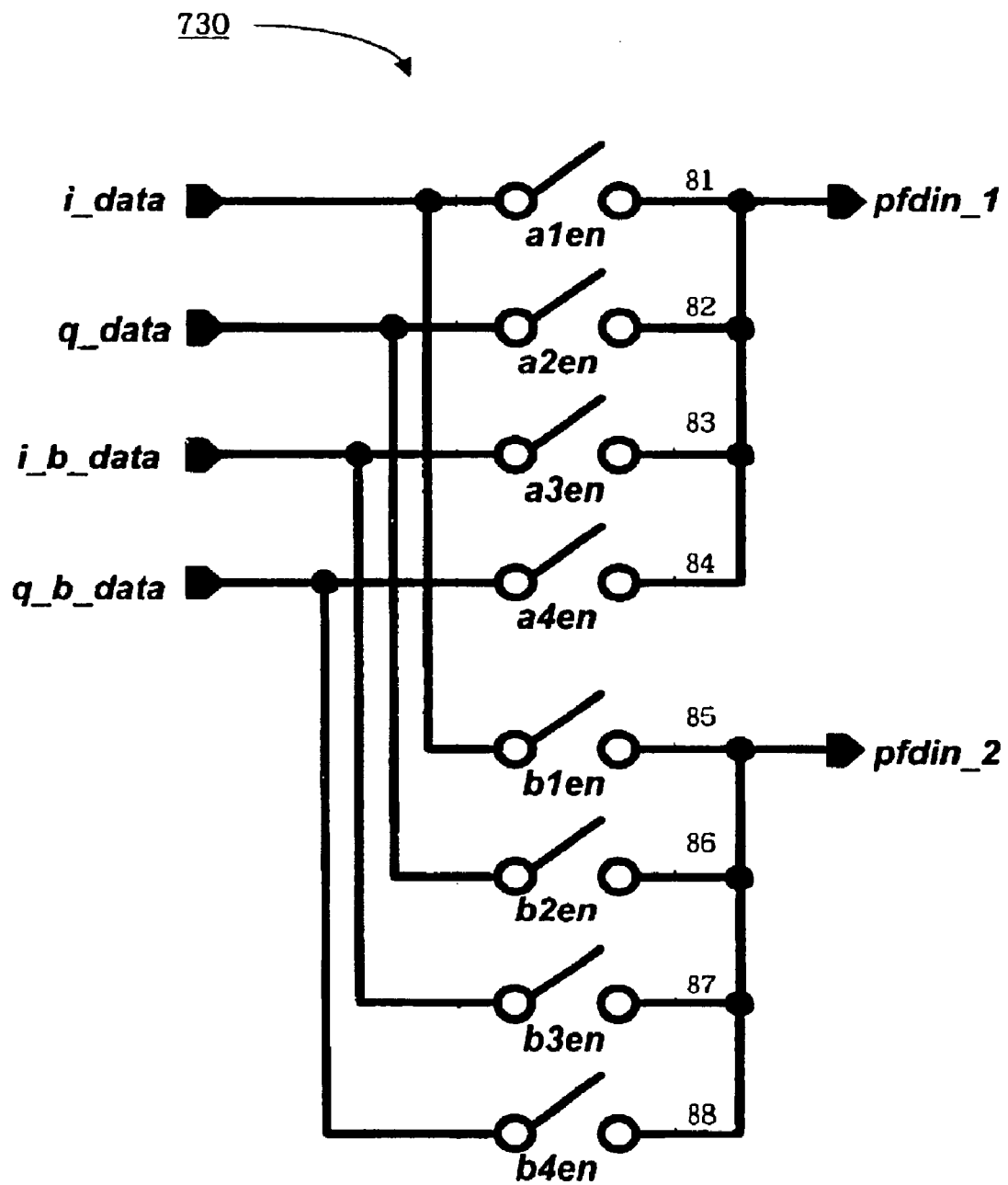
FIG. 8 is a detailed diagram of the signal selecting element in FIG. 7.

FIG. 8 is a detailed diagram of the signal selecting element (730) shown in FIG. 7. As illustrated in the figure, it includes: Switches (81, 82, 83 and 84) that interrupt signals I, Q, I_b and Q_b, which are output in parallel from the divider (720), and output one of them (pfdin_1); and Switches 5 through 8 (85, 86, 87 and 88) that branch and interrupt signals I, Q, I_b and Q_b and output one of them (pfdin_2).

Figure 9:
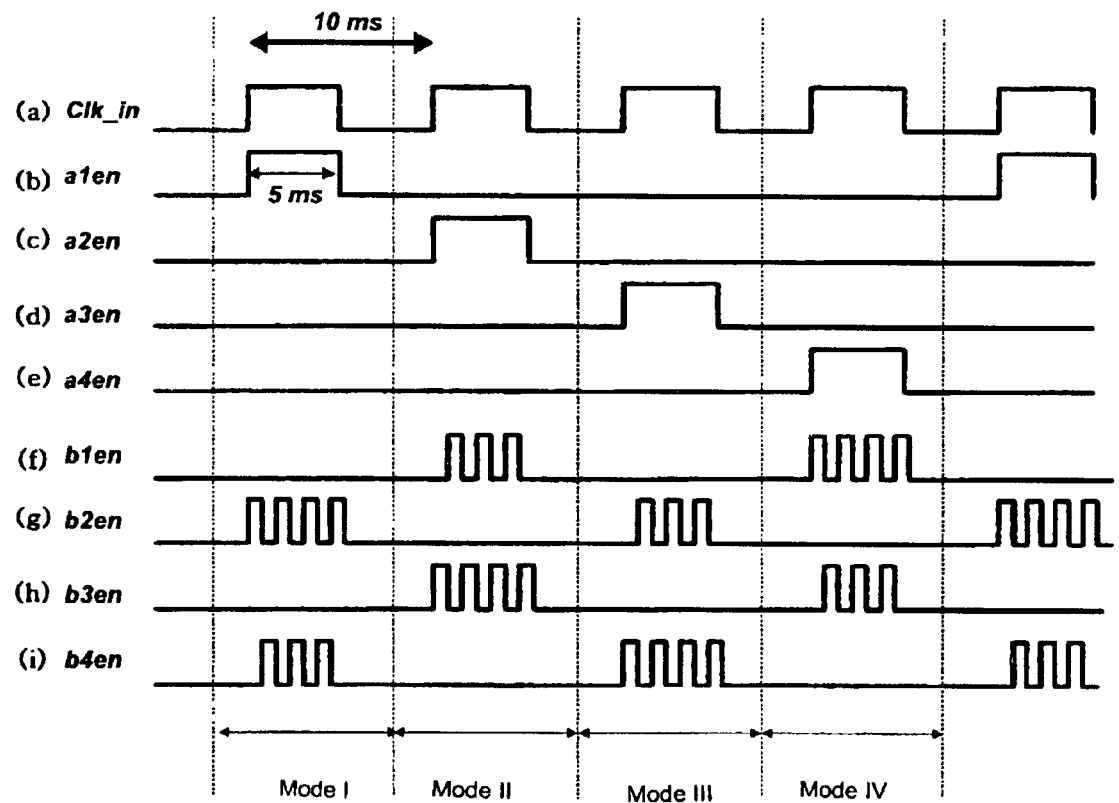
FIG. 9 is a clock timing diagram of various control signals generated from the control element in FIG. 7.

FIG. 9 is the clock timing diagram of various control signals generated from the control element in FIG. 7. Signal (a) is the reference clock signal (CLK_in), which is either input from outside or self-oscillating, with a clock period of 10 ms. Based on this reference clock signal (CLK_in, various control signals as shown in signals 9 (b) through (i) are generated, which are clock signals 1 through 8 (a1–4en, b1–4en) to interrupt switches 1 through 8 (81–88) in FIG. 8, respectively, and to select the relevant signals.

In FIG. 9, in order to select signals by controlling the switching of switches 1 through 8 (81–88) in the signal selecting element (730), the control element (780) generates clock signals (a1–4en) of (b)~(e) that select one of the four signals in sequence that are divided and output by the divider (720) and clock signals 5 through 8 (b1–4en) that select two signals, adjacent to the signal selected in accordance with the clock signals (a1–4en), alternately during the period the clock signals (a1–4en) are held, and applies these clock signals to switches 1 through 8 (81–88) to control the switching of the relevant switches.

The period of the reference clock signal (CLK_in) is 10 ms. The clock signals 1 through 8 (a1–4en, b1–4en) are generated synchronously with the reference clock signal (CLK_in). Ideally, the clock holding time of the clock signals (a1–4en) is 5 ms, and the clock signals 5 through 8 (b1–4en) are generated alternately multiple times during the clock holding time of the clock signal 1, 2, 3 or 4. Also, the control element (780) generates the control signal for selecting the path in the path selecting element (760) in response to the signals in FIG. 9(b)–(i) so that the relevant voltage signal(s) (one of Vcon1~Vcon4) can be supplied to the relevant varactor from among the varactors (VD1–VD4).

Also, the signal holding element (770) has the same configuration as the four capacitors (C) illustrated in FIG. 2. In some embodiments, it is included in the components of the polyphase filter (200) during the manufacturing process of the polyphase filter (200). In some embodiments, it is included in the components of the phase correction apparatus (700) during the manufacturing process of the phase correction apparatus (700).

Now, we will describe the operation of the quadrature signal generator in accordance with the second embodiment of this invention as illustrated in FIG. 7.

Figure 10:
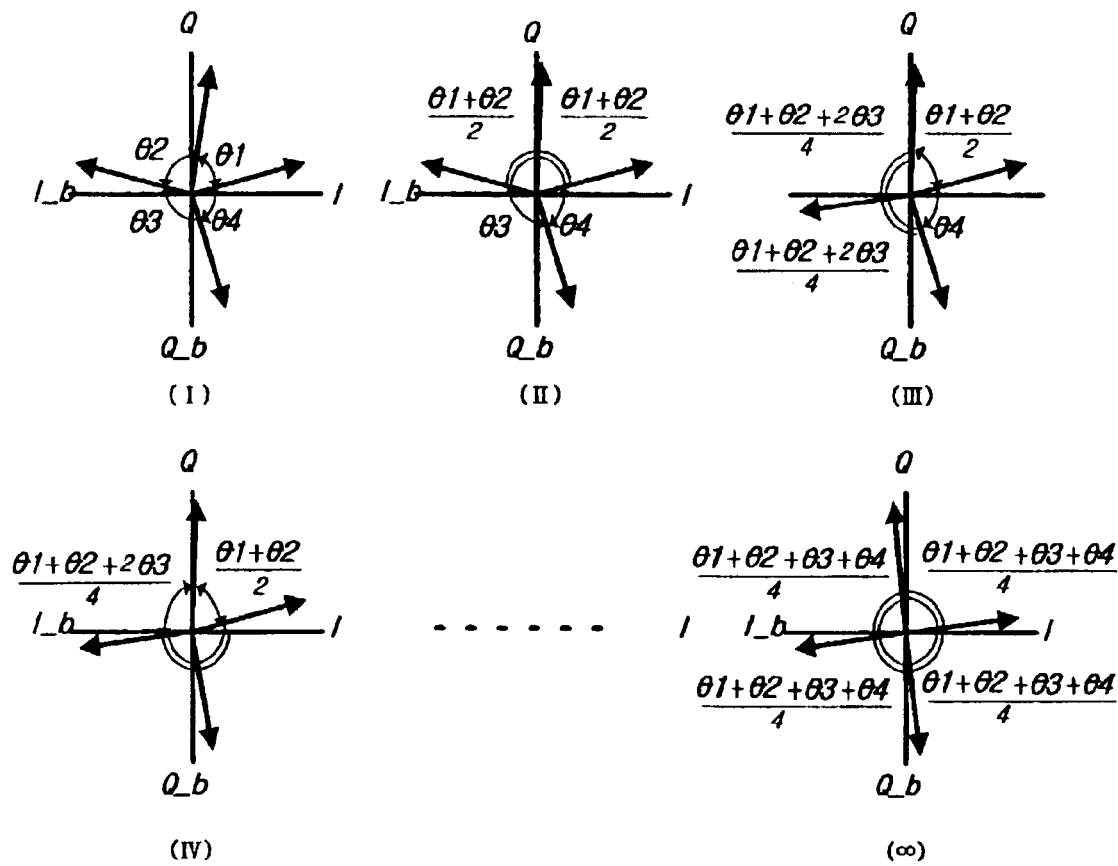
FIG. 10 shows the phase changes of the output waveform of the polyphase filter following the sequential performance of each mode in the embodiment of FIG. 7.

First, we will regard mode I in FIG. 9 as the initial state, and then describe the successive modes II, III and IV, assuming the phase differences of signal I, signal Q, signal I_b, and signal Q_b, each of which is output from the output terminals (OUT1–OUT4) of the polyphase filter (200) in its initial state, to be θ1, θ2, θ3, and θ4 as shown in FIG. 10 (I).

Entering mode II from the initial state of the mode I, the control element (780) applies clock signal 2 (a2en) in FIG. 9(c) to the switch 2 (82) of the signal selecting element (730) based on the reference clock signal (CLK_in), to make an electric current flow through switch 2 (82) so that signal Q from the mode I is selected for output, and also applies clock signal 5 (b1en) in FIG. 9(f) and clock signal 7 (b3en) in FIG. 9(h) to the switch 5 (85) and the switch 7 (87) alternately in the order ①, ②, ③, ④, ⑤, ⑥, and ⑦ during the high clock holding period of the clock signal 2 (a2en), to make an electric current flow through the relevant switch (85 or 87) alternately so that signal I_b from the mode I is output in odd number order—①, ③, ⑤, and ⑦, and signal I is output in even number order—②, ④, and ⑥.

Signals Q and I and the signals Q and I_b, which were selected in the signal selecting element (730) and output in parallel, are input to the phase frequency detector (740) alternately so that the phase differences between the signals are detected. The phase frequency detector (740) supplies the current signal proportional to the phase difference so detected as the input to the charge pump (750).

Figure 11:
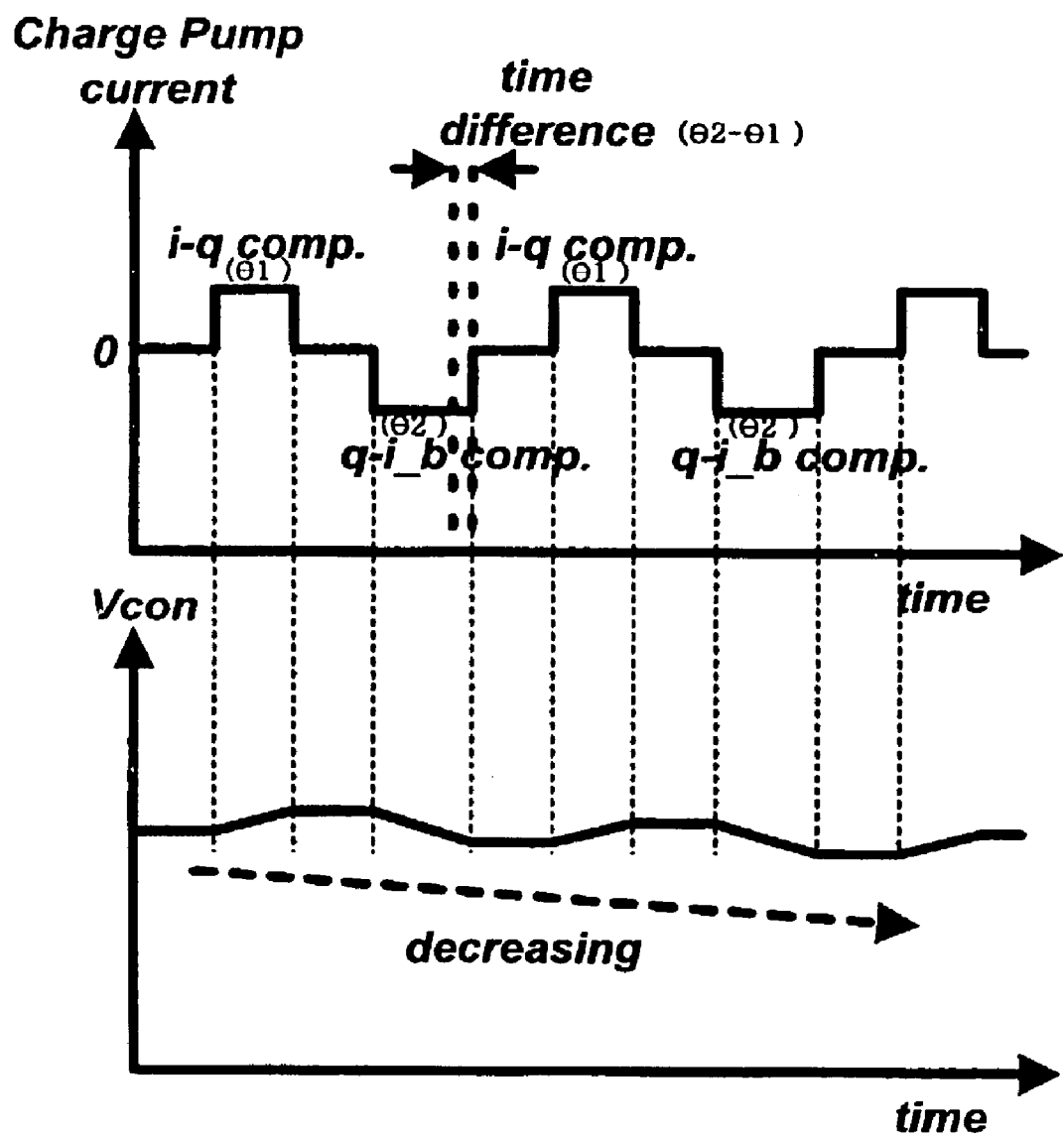
FIG. 11 is a diagram for explaining the operation principle of the charge pump in FIG. 7.

The charge pump (750) operates as illustrated in FIG. 11. In FIG. 11, a pull-up current is received from the phase frequency detector (740) and the charge is accumulated in the capacitor of the charge pump (750) during the time proportional to the phase difference (which is θ1) between signal I and signal Q, and a pull-down current is received from the phase frequency detector (740) and the charge is leaked from the capacitor of the charge pump (750) during the time proportional to the phase difference (which is θ2) between signal Q and signal I_b. Accordingly, the charge pump (750) charges or discharges with the time illustrated in FIG. 11(a), and the voltage signal (Vcon) is output in response thereto as in (b). Here, if we assume that θ2 is larger than θ1, the discharging time is longer than the charging time by TD as illustrated in FIG. 11 because of such difference in angles, resulting in the voltage signal (Vcon) in (b) decreasing gradually with time. Such an operational principle is the same for each charge pump (341–344) in FIG. 3 described above.

The voltage signal (Vcon) as in FIG. 11(b) is supplied as an input to the path selecting element (760), and the path selecting element (760) supplies the voltage signal (Vcon) as the voltage (control) signals (Vcon1, Vcon2) for varying the capacitance of the varactors 1 and 2 (VD1, VD2) among the varactors (VD1–VD4) of the polyphase filter (200) according to the path selection signal of the control element (780).

As a result of the operation in mode II, ∠I,Q and ∠Q,I_b, which were θ1 and θ2 respectively in FIG. 10 (I) in mode I with θ1<θ2, become the same as (θ1+θ2)/2 and (θ1+θ2)/2 as shown in FIG. 10 (II), as θ2 is made smaller.

Proceed to mode III with the method corresponding to the operation in mode II as described above, ∠Q,I_b and ∠I_b,Q_b, which were (θ1+θ2)/2 and θ3 respectively in FIG. 10 (II) in mode II, become the same as (θ1+θ2+2θ3)/4 and (θ1+θ2+2θ3)/4 as shown in FIG. 10 (III). Proceed to mode IV, ∠I_b,Q_b and ∠Q_b,I, which were (θ1+θ2+2θ3)/4 and θ4 respectively in FIG. 10 (III) in mode III, become the same as (θ1+θ2+2θ3+4θ4)/8 and (θ1+θ2+2θ3+4θ4)/8 as shown in FIG. 10 (IV).

In successive operations in mode I, II, III and IV as above, the voltage control signal (Vcon), other than the voltage control signal (Vcon) selected in any mode operation, is stored in the relevant signal holding element (770) (or C) that corresponds to the relevant mode of prior operation and maintains a certain value for a certain period of time. This time interval depends on the leakage characteristics of the capacitor (C) that constitutes the signal holding element (770).

As described above, if modes I, II, III and IV are repeated infinitely in sequence, then as a result the phase differences between the signals I, Q, I_b and Q_b, which are output respectively through the output terminals (OUT1–OUT4), will all be the same as (θ1+θ2+θ3+θ4)/4 as shown in FIG. 10 (∞), where each of the phase differences is 90 degrees. The mathematical expressions are the same as previously described in FIG. 6 for a first embodiment of this invention. Therefore, the more the operation is repeated, the smaller the phase error range between the signals.

Figure 12:
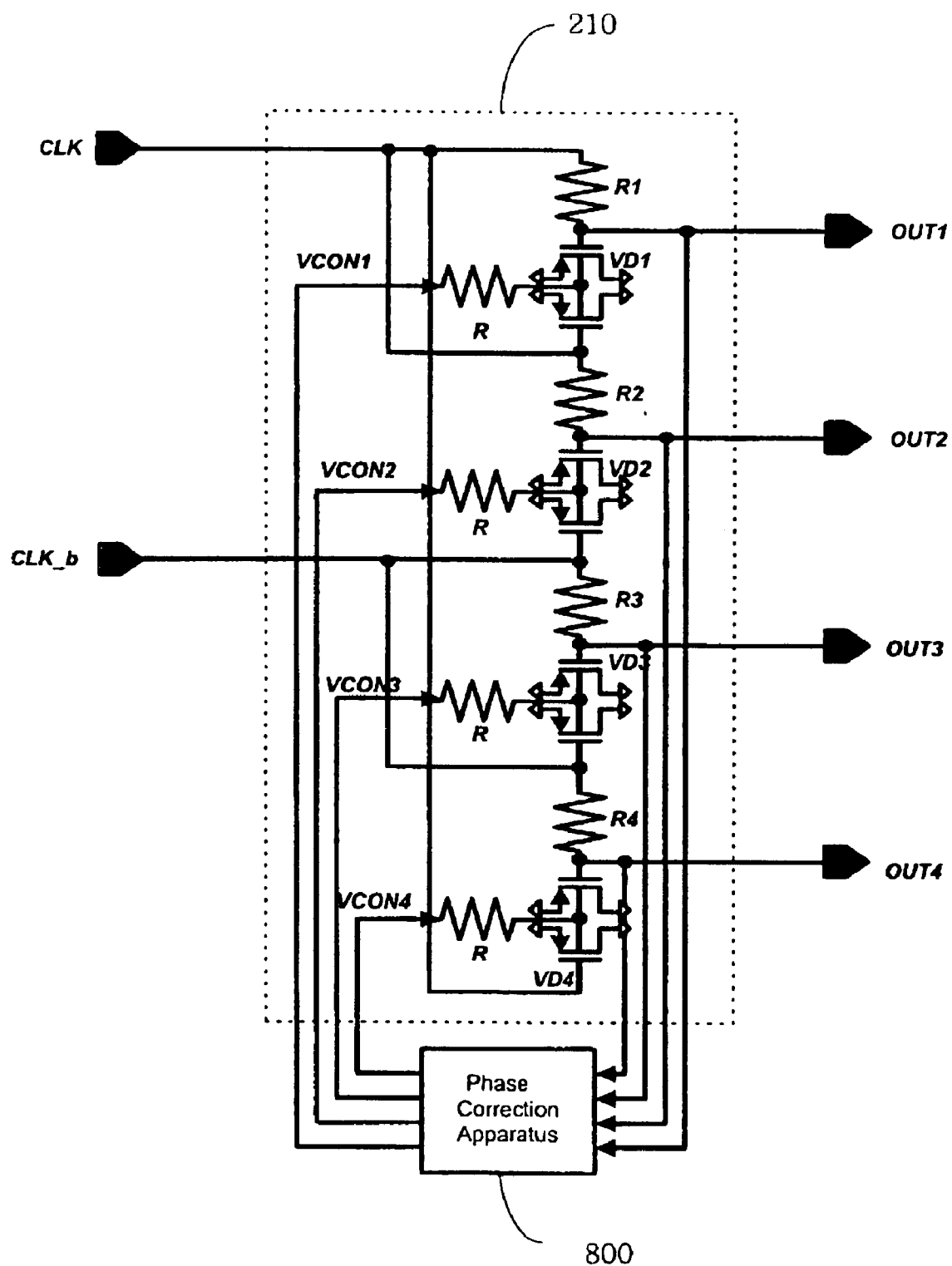
FIG. 12 is a circuit diagram of the polyphase filter in accordance with a second embodiment of this invention.

FIG. 12 is the circuit diagram of the polyphase filter (210) in accordance with a second embodiment of this invention. As illustrated in the figure, four resistors (R1, R2, R3 and R4) as the resistive elements and four varactors (VD11, VD12, VD13 and VD14) as the variable capacitive elements are connected to each other alternately in series to form a loop. Output terminal 1 (OUT1) is connected to the common point of the resistor 1 (R1) and the varactor 1 (VD11), output terminal 2 (OUT2) is connected to the common point of the resistor 2 (R2) and the varactor 2 (VD12), output terminal 3 (OUT3) is connected to the common point of the resistor 3 (R3) and the varactor 3 (VD13), and output terminal 4 (OUT4) is connected to the common point of the resistor 4 (R4) and the varactor 4 (VD14).

Input terminal 1 (CLK) is connected to the common point of the varactor 1 (VD11) and the resistor 2 (R2) and to the common point of the varactor 4 (VD14) and the resistor 1 (R1), and input terminal 2 (CLK_b) is connected to the common point of the varactor 2 (VD12) and the resistor 3 (R3) and to the common point of the varactor 3 (VD13) and the resistor 4 (R4).

Each of the varactors (VD11, VD12, VD13 and VD14) includes two PMOS transistors 1 and 2 (PMOS1, PMOS2). The source and the drain of the PMOS1 and PMOS2 are grounded, and each gate is connected to the adjacent relevant resistor (R1, R2, R3 or R4) from among the four resistors (R1–R4). As the bodies of the PMOS1 and PMOS2 are connected to each other, a variable terminal is established for varying the capacitance of the corresponding varactor (VD1–VD4) at the common point of the bodies via the medium of a resistor.

Also, a phase correction apparatus (800) is added between the variable terminal of each said varactor (VD11–VD14) and the output terminals (OUT1–OUT4). The purpose of the phase correction apparatus (800) is to correct the phase error of the quadrature signals, which are output through the output terminals (OUT1–OUT4), by variably controlling the capacitance of the varactors (VD11–VD14) based on the feedback signals output through the output terminals (OUT1–OUT4). Four capacitors (C) with one end grounded are connected in the line that connects the output terminals of the phase correction apparatus (800) and the variable terminals of each said varactor (VD1–VD4).

Figure 13:
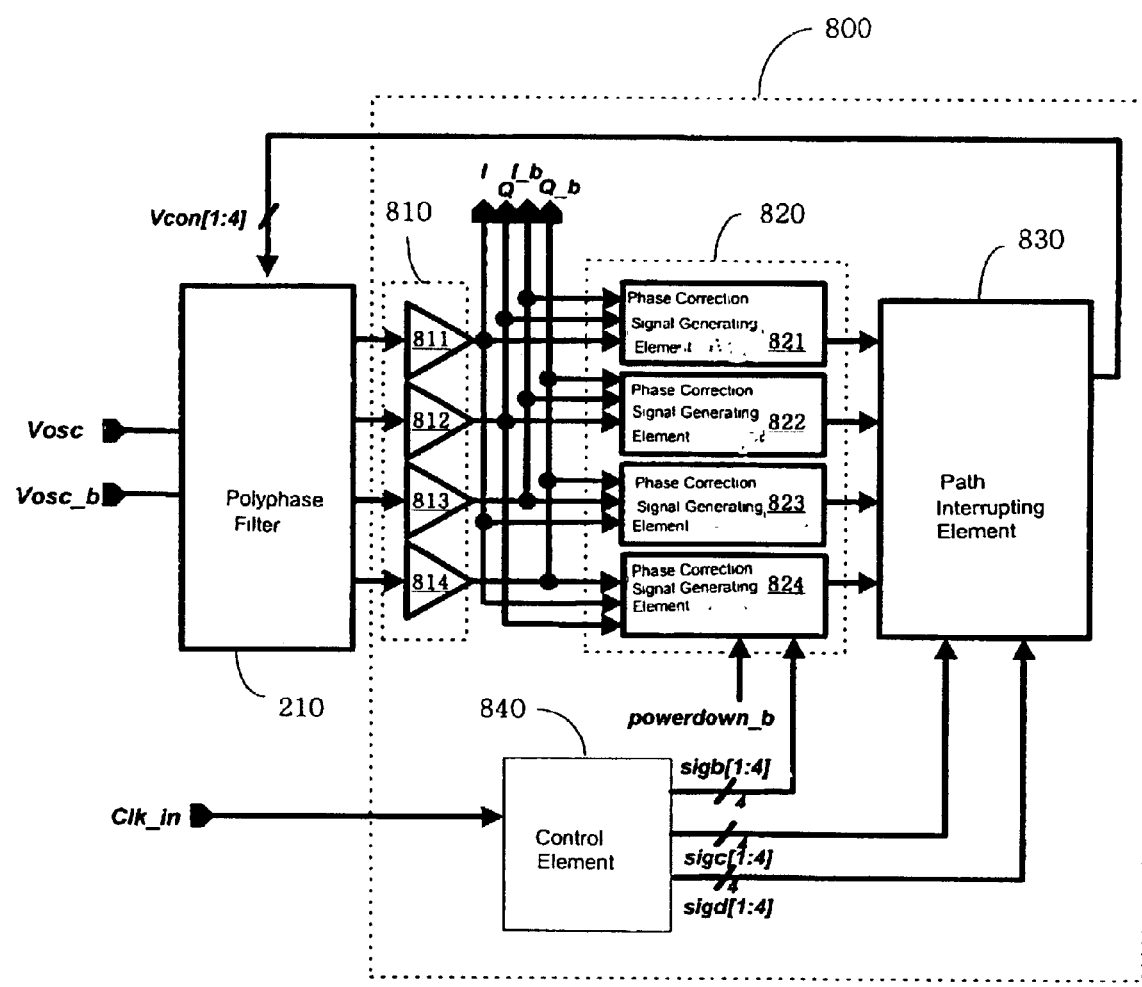
FIG. 13 is a block diagram of the quadrature signal generator in accordance with a third embodiment of this invention.

FIG. 13 is the block diagram of a quadrature signal generator embodiment in accordance with the present invention, and includes a combination of the polyphase filter (200) in FIG. 2 and the phase correction apparatus (800).

FIG. 13 includes the polyphase filter (200), which receives through the input terminals 1 and 2 (CLK, CLK_b) clock signal 1 (Vosc) with a phase of 0 degrees and clock signal 2 (Vosc_b) with an inverse phase of 180 degrees as supplied from, for instance, a voltage control oscillator (not shown) and outputs four signals (I, Q, I_b, and Q_b) with quadrature phases through the output terminals (OUT1–OUT4), and the phase correction apparatus (800).

The phase correction apparatus (800) includes: Drivers (810: 811, 812, 813, and 814) that receive four quadrature signals (I, Q, I_b, and Q_b) from the output terminals (OUT1–OUT4) of the polyphase filter (210) and output them after driving; Phase Correction Signal Generating Elements (820: 821, 822, 823, and 824) that take three signals in sequential combination out of the four quadrature signals (I, Q, I_b and Q_b) that are output through the drivers (811–814), compare the phase difference between the two adjacent signals among the three quadrature input signals (i.e., I, Q, and I_b; Q, I_b, and Q_b; I_b, Q_b, and I; or Q_b, I, and Q), and output the voltage control signal (Vcon1, Vcon2, Vcon3 or Vcon4) based on the result of such comparison; the Path Interrupting Element (830) that interrupts the output path of the voltage control signals (Vcon1, Vcon2, Vcon3, and Vcon4) that are output from the phase correction signal generating elements (821–824), so that they may be provided selectively to each variable capacitance terminal of the varactors (VD11–VD14) of the polyphase filter (210); and the Control Element (840) that controls the on/off operation of the phase correction signal generating elements (821–824) and the interrupting operation of the path interrupting element (830) based on the reference clock signal.

Figure 14:
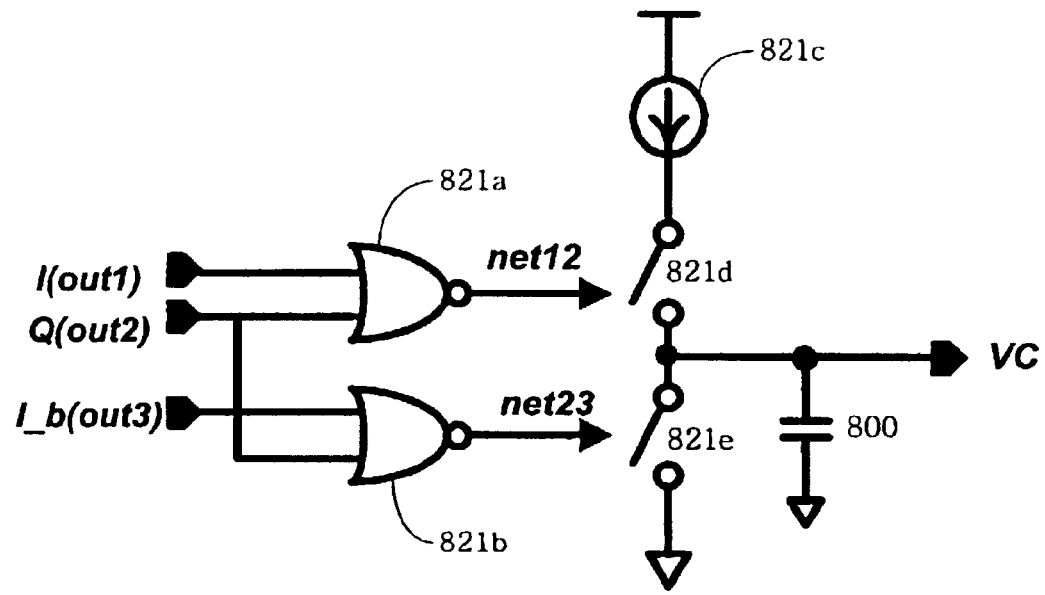
FIG. 14 is a detailed diagram of the phase correction signal generating element in FIG. 13.

FIG. 14 is a detailed diagram of the phase correction signal generating element (821, 822, 823 or 824) in FIG. 13. Taking the phase correction signal generating element 1 (821) as the representative sample, it includes: NOR gate 1 (821a) that receives signal I (out1) and signal Q (out2) from among the four quadrature signals (I, Q, I_b and Q_b) that are output from the drivers (811–814), performs a logical sum, and outputs it (net12) in reverse; NOR gate 2 (821b) that receives signal Q (out2) and signal I_b (out3), performs a logical sum, and outputs it (net23) in reverse; the Current Source (821c) that supplies constant current; Switch 1 (821d) that interrupts the current supplied from the current source (821c) in accordance with the output signal (net12) of the NOR gate 1 (821a); Switch 2 (821e) that is connected to the switch 1 (821d) at one end and is grounded at the other end, provides interruption in accordance with the output signal (net23) of NOR gate 2 (821b); and Capacitor (C) as the charge pump connected between the ground and the common point, at which the output terminal is established, of the switch 1 (821d) and the switch 2 (821e).

Figure 15:
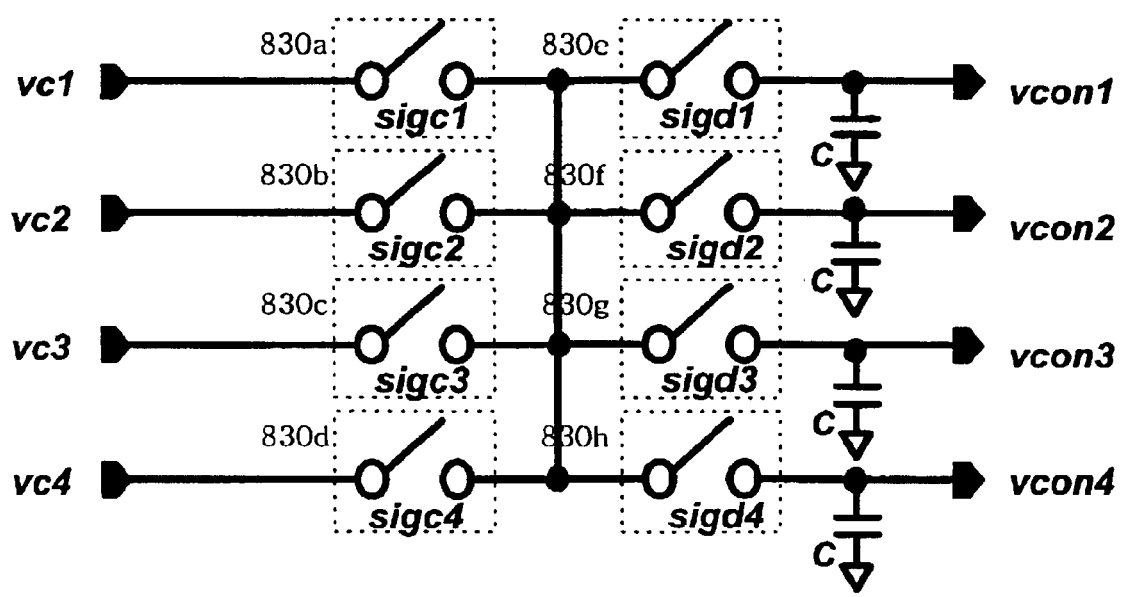
FIG. 15 is a detailed diagram of the path interrupting element of FIG. 13.

FIG. 15 is a detailed diagram of the path interrupting element in FIG. 13. As illustrated in the figure, it includes: Switches (830a, 830b, 830c, and 830d), each of which interrupts the output signal from the phase correction signal generating element (821–824) in accordance with the control signal of the control element (840); Switches 5 through 8 (830e, 830f, 830g, and 830h) that perform interruption in accordance with the control signal of the control element (840), with their input terminals jointly connected to the output terminals of the switches (830a, 830b, 830c, and 830d) but with their output terminals established separately from each other; and the Capacitors (C), each connected as the signal holding element between the output terminal of the switches 5 through 8 (830e, 830f, 830g, and 830h) and the ground.

Now we will describe the operation of the quadrature signal generator in accordance with a third embodiment of this invention as illustrated in FIG. 13.

Figure 16:
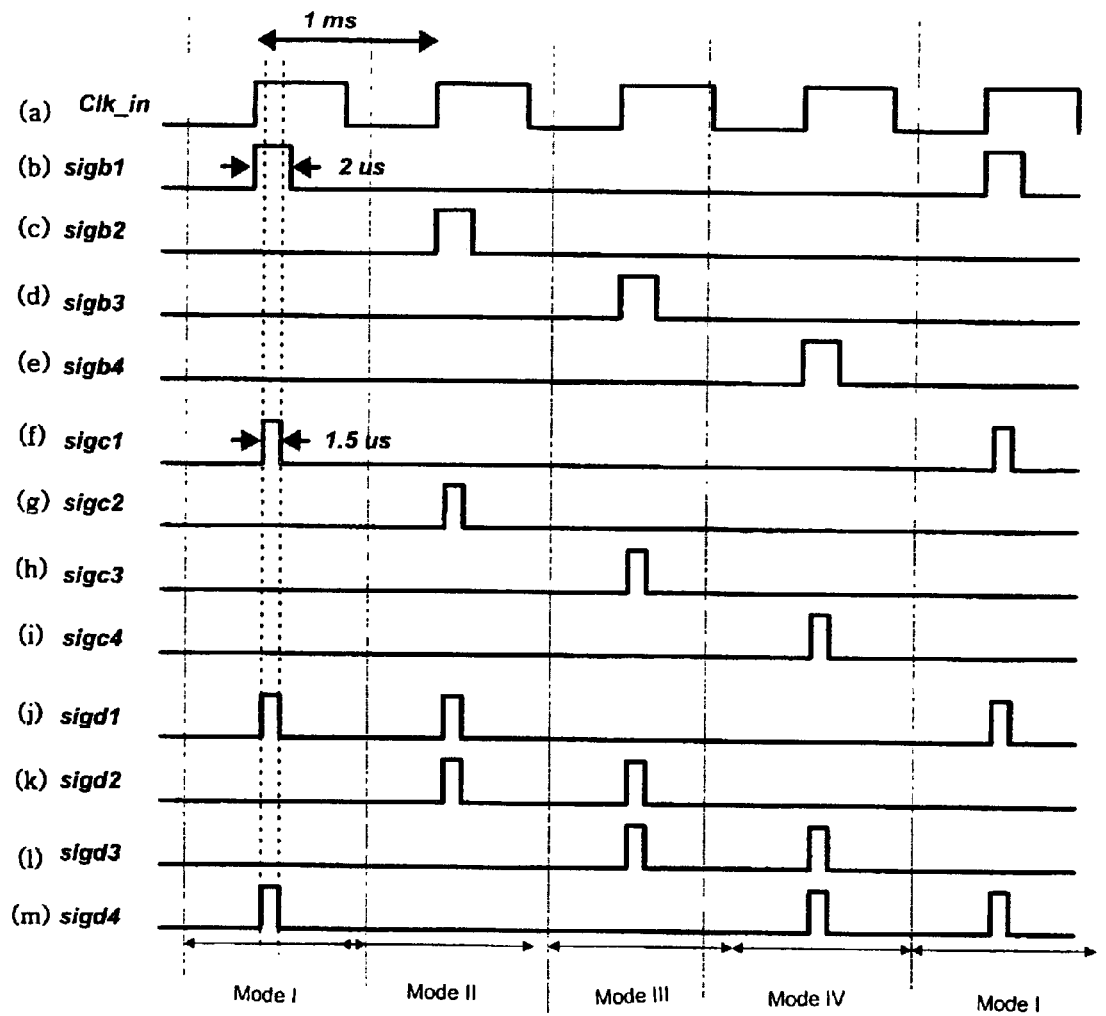
FIG. 16 is a clock timing diagram of various control signals generated from the control element in FIG. 13.

FIG. 16 is a clock timing diagram of various control signals generated from the control element in FIG. 13. Signal (a) is the reference clock signal (CLK_in), which is either input from outside or self-oscillating, with a clock period of 1 ms. Based on this reference clock signal (CLK_in), various control signals (b) through (m) are generated, of which (b)–(e) are the clock signals (sigB1–sigB4) for executing mode 1 (I) through mode 4 (IV) repeatedly in sequence, with a preferred clock holding time of 2 $\mu$s, and (f)–(i) are the clock signals for interrupting the switches (830a, 830b, 830c, and 830d) of the path interrupting element (830), with a preferred clock holding time of 1.5 $\mu$s, and (i)–(m) are the clock signals for interrupting the switches 5 through 8 (830a, 830b, 830c, and 830d) of the path interrupting element (830), with a preferred clock holding time of 1.5 $\mu$s.

Figure 17:
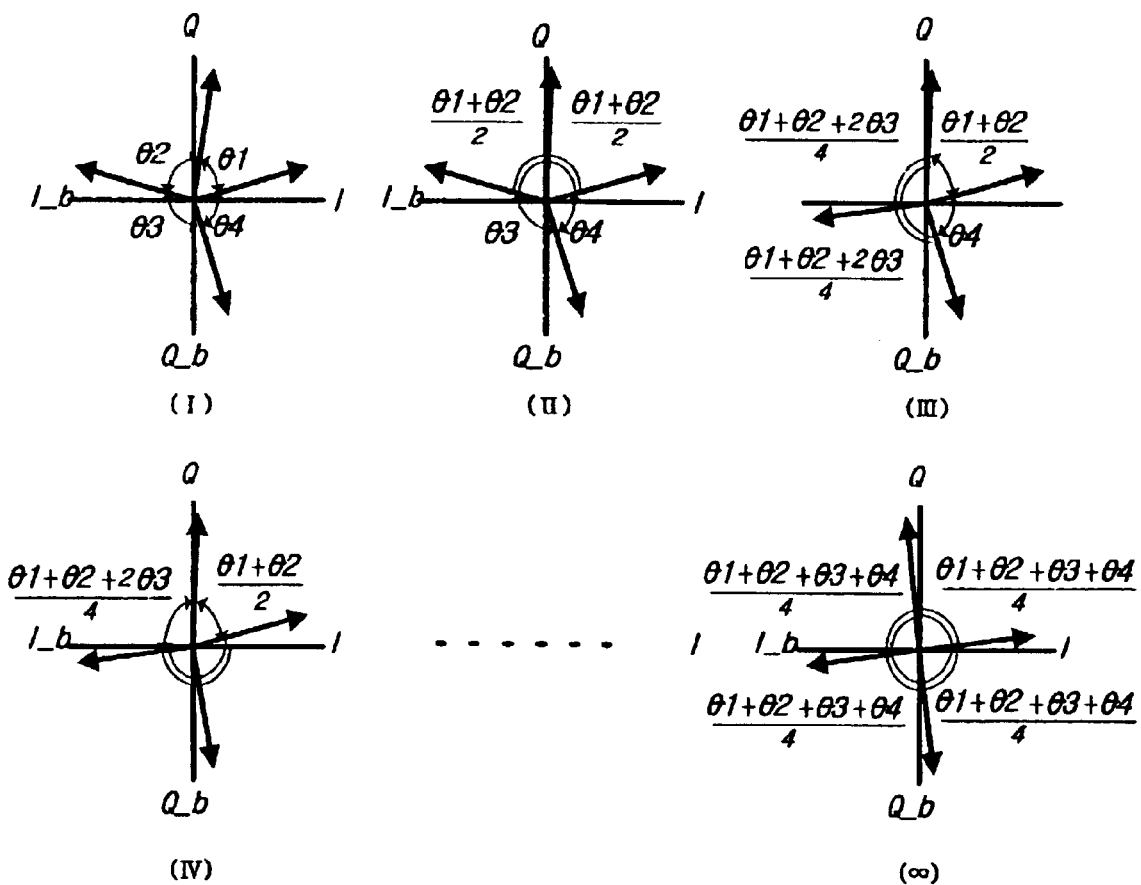
FIG. 17 shows the phase changes of the output waveform of the polyphase filter following sequential performance of each mode in the embodiment of FIG. 13.

First, we will regard mode I in FIG. 16 as the initial state, and then describe the successive modes II, III and IV, assuming the phase differences of signal I, signal Q, signal I_b, and signal Q_b, each of which is output from the output terminals (OUT1–OUT4) of the polyphase filter (210) in its initial state, to be $\theta1$, $\theta2$, $\theta3$, and $\theta4$ as shown in FIG. 17 (I).

Figure 18:
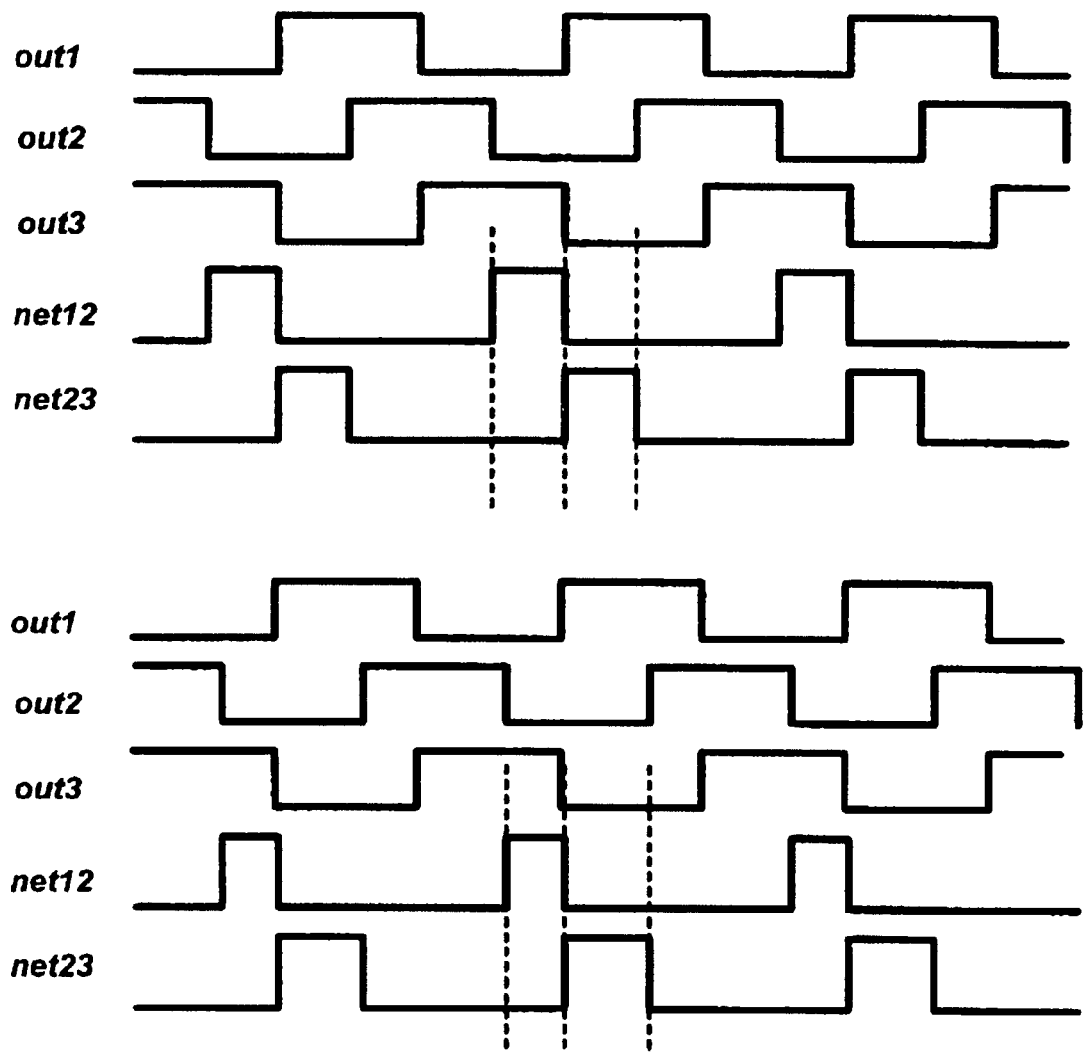
FIG. 18 is an action timing diagram of the phase correction signal generating element in FIG. 14.

Entering mode II from the initial state of the mode I, the control element (840) outputs signal sigB2 in FIG. 16(c) and activates the phase correction signal generating element 1 (821) based on the reference clock signal (CLK_in). Then, signals I, Q and I_b among the four quadrature signals (I, Q, I_b and Q_b) that are output from the drivers (811–814) are input to the phase correction signal generating element 1 (821), and the NOR gate 1 (821a) of the phase correction signal generating element 1 (821) receives the signal I (out1) and the signal Q (out2), performs a logical sum, and outputs it in reverse, and the NOR gate 2 (821b) receives the signal Q (out2) and the signal I_b (out3), performs a logical sum, and outputs it in reverse. The output signals (net12, net23) of the NOR gates 1 and 2 (821a, 821b) outputs high signals only when the two signals received as in FIG. 18a and FIG. 18b are both low.

Figure 19:
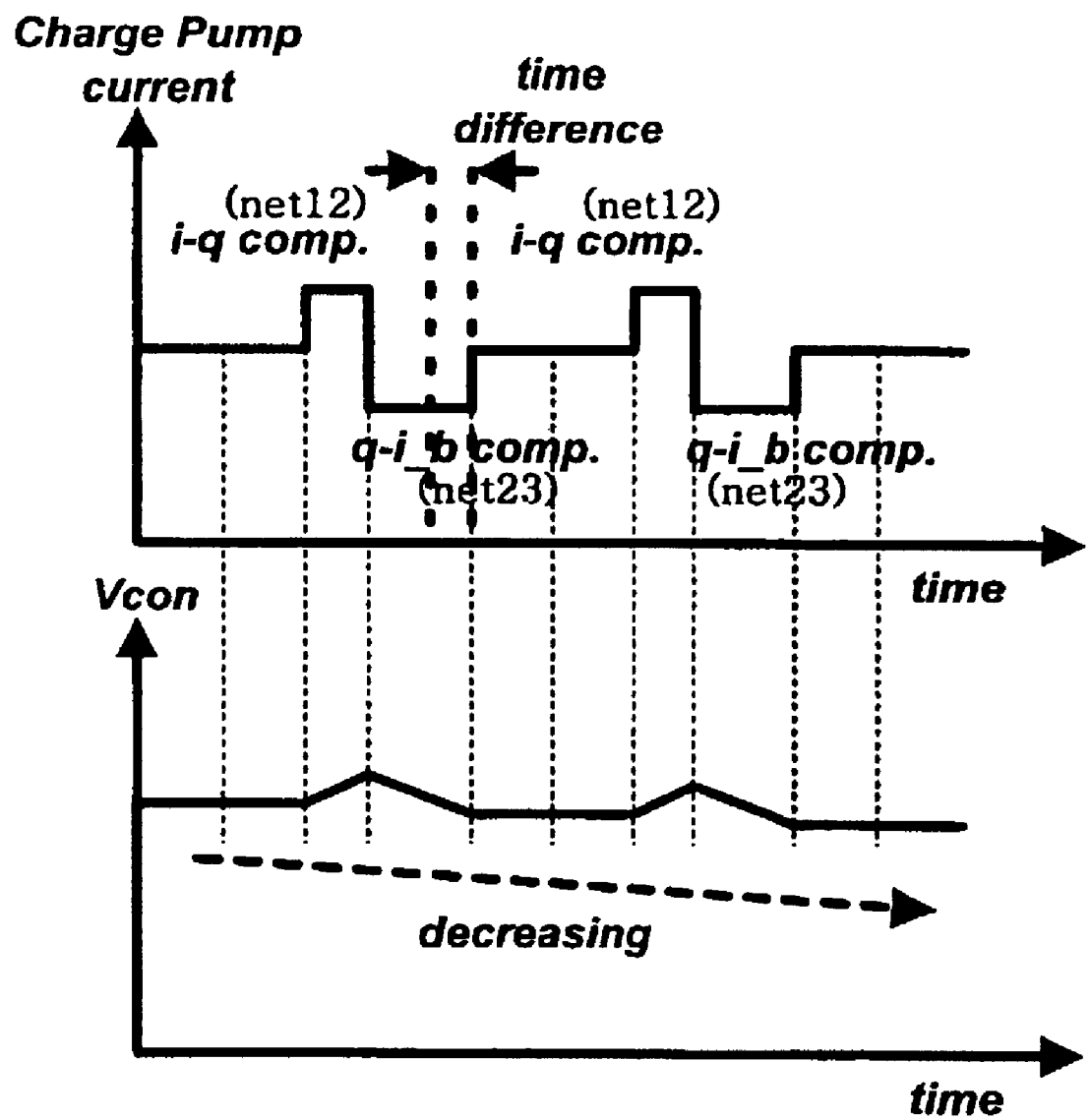
FIG. 19 is a diagram for explaining the principle of generating the voltage control signal in accordance with the charge pump in FIG. 14.

The switches 1 and 2 (821d, 821e) are switched on/off depending on the output signals (net12, net23) of the NOR gates 1 and 2 (821a, 821b). While the switch 1 (821d) is on and the switch 2 (821e) is off, a current is supplied from the current source (821c) to the charge pump (C), making the charge pump (C) pull up. Conversely, while the switch 1 (821d) is off and the switch 2 (821e) is on, the current supply from the current source (821c) to the charge pump (C) is blocked, making the charge pump (C) pull down. The voltage control signal (VC2) is generated and output as the phase correction signal according to the pull-up and the pull-down of the charge pump (C) as above. Therefore, if the phase difference between, for example, $\angle$I,Q and $\angle$Q,I_b is 90 degrees as in FIG. 18a, the pull-up time and the pull-down time of the charge pump (C) become equal, and the amplitude of the voltage control signal (Vcon1) remains constant. If the phase difference between, for instance, $\angle$I,Q and $\angle$Q,I_b is not 90 degrees as in FIG. 18a, that is, if $\angle$I,Q is smaller than $\angle$Q,I_b, then the high pulse holding time of the output signal net12 becomes shorter than the high pulse holding time of the output signal net23, and accordingly the pull-up time becomes shorter than the pull-down time of the charge pump (C) as in FIG. 19, resulting in the voltage control signal (VC2) decreasing gradually.

As above, the phase correction signal generating elements (821–824) generate voltage control signals (VC1–VC4), respectively, which are input to the path interrupting element (830). With the input of the voltage control signal 2 (Vcon2), the control element (840) applies clock signal (sigC2) of FIG. 16(g), clock signal (sigD1) of (j), and clock signal (sigD2) of (k) to the switch 2 (830b), the switch 5 (830e), and the switch 6 (830f) of the path interrupting element (830), respectively, to switch on the relevant switches. Then, the voltage control signal (VC2) as input above is supplied as the voltage control signals (Vcon1, Vcon2) for varying the capacitance of varactors 1 and 2 (VD11, VD12) among the varactors (VD11–VD14) of the polyphase filter (210).

As a result of the operation in mode II, $\angle$I,Q and $\angle$Q,I_b, which were $\theta1$ and $\theta2$ respectively in FIG. 17 (I) in the mode I with $\theta1<\theta2$, become the same as $(\theta1+\theta2)/2$ and $(\theta1+\theta2)/2$ as shown in FIG. 17 (II), as the phase of the signal Q is corrected to make $\theta2$ smaller.

If we proceed to mode III with the method corresponding to the operation in mode II as described above, $\angle$Q,I_b and $\angle$I_b,Q_b, which were $(\theta1+\theta2)/2$ and $\theta3$ respectively in FIG. 17 (II) in the mode II, become the same as $(\theta1+\theta2+2\theta3)/4$ and $(\theta1+\theta2+2\theta3)/4$ as shown in FIG. 17 (III), and if we proceed to mode IV, $\angle$I_b,Q_b and $\angle$Q_b,I, which were $(\theta1+\theta2+2\theta3)/4$ and $\theta4$ respectively in FIG. 17 (III) in the mode III, become the same as $(\theta1+\theta2+2\theta3+4t4)/8$ and $(\theta1+\theta2+2\theta3+4\theta4)/8$ as shown in FIG. 17 (IV).

In the successive operations in modes I, II, III and IV as above, the voltage control signals (Vcon), other than the voltage control signal (Vcon) selected in any mode operation, are stored in the relevant signal holding element (770) (or C) that corresponds to the relevant mode of prior operation and maintain a certain value for a certain period of time, and this time interval depends on the leakage characteristics of the capacitor (C) as the signal holding element (770).

As described above, if we repeat modes I, II, III and IV infinitely in sequence, then as a result the phase differences between the signals I, Q, I_b and Q_b that are output respectively through the output terminals (OUT1–OUT4) will be all the same as $(\theta1+\theta2+\theta3+\theta4)/4$ as shown in FIG. 17 ($\infty$), each of the phase differences being 90 degrees. The mathematical expressions are the same as previously described in FIG. 6 for a first embodiment of this invention. Therefore, the more the operation is repeated, the smaller the phase error range between the signals.

As described in detail in the above, the polyphase filter, the quadrature signal generator using the polyphase filter, and the phase error correction method of the quadrature signal generator in this invention are effective in: generating the optimum quadrature signals by mutually comparing the feedback quadrature signals output from the polyphase filter and by repeating phase corrections based on the result of such comparisons to minimize the phase error; and minimizing the power consumption by correcting the phases one by one in sequence in the above operations and allowing the other three phases to maintain the value previously corrected, so that it is not necessary to make all the component blocks operate at the same time.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A quadrature signal generator including:
a polyphase filter where four resistive elements and four variable capacitive elements are connected alternately in series to form a loop, including: a first output terminal connected to the common point of a first resistive element and a first variable capacitive element; a second output terminal connected to the common point of a second resistive element and a second variable capacitive element; a third output terminal connected to the common point of a third resistive element and a third variable capacitive element; a fourth output terminal connected to the common point of a fourth resistive element and a fourth variable capacitive element; a first input terminal at the common point of the first variable capacitive element and the second resistive element and at the common point of the fourth variable capacitive element and the first resistive element; a second input terminal at the common point of the second variable capacitive element and the third resistive element and at the common point of the third variable capacitive element and the fourth resistive element; and wherein the phase corrector is connected between the output terminals and the variable capacitive elements, variably controlling the capacitance of the variable capacitive elements based on the signals output from the output terminals; and
a phase corrector that variably controls the capacitance of the variable capacitive elements.

2. A quadrature signal generator as recited in claim 1 wherein the phase corrector includes:
dividers that divide the signals output from output terminals of the polyphase filter;
phase frequency detectors that take two signals in sequential pairs from among the four output signals from the dividers, detect the phase difference of each pair of signals, and output the current signals corresponding to the phase difference so detected;
charge pumps that charge or discharge in response to the current signals output from the phase frequency detectors;
loop filters that filter each voltage output following the charging or discharging of the charge pumps;
comparators that take two signals in sequential pairs from among the four voltage signals that have been filtered and output from the loop filters, compare the magnitudes of each pair, and output clock signals in accordance with the result of such comparison;
a multiplexer that multiplexes the clock signals output from the comparators and selects one signal for output;
an integrator that integrates the selected signal for output;
a path selecting element that selects the path for the output signal from the integrator to be provided selectively to one or more of the variable capacitive elements as the voltage signal for varying the capacitance;
a control signal generator that generates a control signal based on a reference clock signal and outputs the control signal to the corresponding components, wherein the control signal includes a first clock signal that enables one or more components among the dividers, the phase frequency detectors, the charge pumps, the loop filters, and the comparators, of which there are four in all, and a second clock signal that controls the selection of the output signal and the output holding time in the multiplexer, and a third clock signal that controls the path selection of the path selecting element; and a voltage control signal holding element that holds the voltage control signal output from the path selecting element for a certain time, to characterize the quadrature signal generator.

3. A quadrature signal generator as recited in claim 2 wherein the control signal is set to make the clock holding time of the first clock signal shorter than the clock holding time of the reference clock signal and to make the clock holding time of the second clock signal shorter than the clock holding time of the first clock signal but equal to the clock holding time of the third clock signal.

4. A quadrature signal generator as recited in claim 2 the variable capacitor elements include varactors.

5. A quadrature signal generator as recited in claim 1 wherein each of the variable capacitive elements include a first PMOS transistor and a second PMOS transistor, where the gates of the first and second PMOS transistors are connected to each other, and the source and the drain of each PMOS transistor are connected to each other and are connected to the adjacent relevant resistor, and also an output terminal of a voltage control signal selecting element is connected to the common point of the gates.

6. A quadrature signal generator as recited in claim 1 wherein the phase corrector includes:
a divider that takes signals in parallel from output terminals of the polyphase filter, divides, and outputs in parallel;
a signal selecting element that selects two adjacent signals as a pair of output signals from among the four signals received from the dividers;
a phase frequency detector that detects the phase difference of the pairs of output signals from the signal selecting element and outputs a corresponding current signal;
a charge pump that charges or discharges in response to the current signal;
a path selecting element that selects a path for a voltage signal following the above charging or discharging to be provided selectively to one or more of the variable capacitive elements;
a signal holding element that holds the voltage signal provided to the selected variable capacitive elements through the path selecting element for a certain time; and a control element that controls the signal selection in the signal selecting element and the path in the path selecting element based on a reference clock signal, to characterize the quadrature signal generator.

7. A quadrature signal generator as recited in claim 6 wherein the control element generates a first clock signal that selects the four divided output signals one by one in sequence as the control signal for the signal selection, and a second and third clock signals that select the two signals alternately that are adjacent to the signal selected as per the first clock signal during the duration of the first clock signal.

8. A quadrature signal generator as recited in claim 6 wherein the control element generates the control signal for the path selection based on the control signal for the signal selection.

* * * * *